United States Patent
Seong et al.

(10) Patent No.: US 9,508,551 B2
(45) Date of Patent: Nov. 29, 2016

(54) METHOD OF FABRICATING A SEMICONDUCTOR DEVICE AND A SEMICONDUCTOR DEVICE FABRICATED BY THE METHOD

(71) Applicant: SAMSUNG ELECTRONICS CO., LTD., Gyeonggi-do (KR)

(72) Inventors: Hojun Seong, Gyeonggi-do (KR); Jae-Hwang Sim, Gyeonggi-do (KR); Jeehoon Han, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/665,141

(22) Filed: Mar. 23, 2015

(65) Prior Publication Data

US 2015/0325478 A1 Nov. 12, 2015

(30) Foreign Application Priority Data

May 9, 2014 (KR) .................. 10-2014-0055685

(51) Int. Cl.
*H01L 21/00* (2006.01)
*H01L 23/00* (2006.01)
(Continued)

(52) U.S. Cl.
CPC ..... *H01L 21/0337* (2013.01); *H01L 21/31144* (2013.01); *H01L 21/32139* (2013.01); *H01L 21/76892* (2013.01); *H01L 21/76895* (2013.01); *H01L 23/528* (2013.01); *H01L 27/11526* (2013.01); *H01L 27/11573* (2013.01); *H01L 27/11529* (2013.01)

(58) Field of Classification Search
CPC ............ H01L 21/311; H01L 21/3213; H01L 21/32139; H01L 27/11526; H01L 21/76895; H01L 27/11573; H01L 21/76892; H01L 23/528; H01L 21/31144; H01L 27/11529; H01L 2924/14; H01L 2924/01079; H01L 2924/01013; H01L 2924/01029; H01L 2924/01078
USPC ........................................................ 257/773
See application file for complete search history.

(56) References Cited

U.S. PATENT DOCUMENTS 8,242,022 B2   8/2012  Kim
8,309,462 B1   11/2012 Yoshida et al.
(Continued)

FOREIGN PATENT DOCUMENTS

JP    2007-012684    1/2007
JP    2011-142219    7/2011
(Continued)

*Primary Examiner* — John C Ingham
*Assistant Examiner* — Didarul Mazumder
(74) *Attorney, Agent, or Firm* — F. Chau & Associates, LLC

(57) ABSTRACT

A method of fabricating a semiconductor device includes stacking an etch target layer, a first mask layer, and a second mask layer on a first surface of a substrate. A plurality of first spacer lines are formed parallel to each other and a first spacer pad line on the second mask layer is formed. A third mask pad in contact with at least the first spacer pad line on the second mask layer is formed. The second mask layer and the first mask layer are etched to form one or more first mask lines, a first mask preliminary pad, and second mask patterns. Second spacer lines are respectively formed covering sidewalls of the first mask preliminary pad and the first mask lines. First mask pads are formed. The etch target layer is etched to form conductive lines and conductive pads connected to the conductive lines.

15 Claims, 39 Drawing Sheets

(51) Int. Cl.
*H01L 27/00* (2006.01)
*H01L 29/00* (2006.01)
*H01L 21/033* (2006.01)
*H01L 21/768* (2006.01)
*H01L 27/115* (2006.01)
*H01L 23/528* (2006.01)
*H01L 21/3213* (2006.01)
*H01L 21/311* (2006.01)

(56) References Cited

U.S. PATENT DOCUMENTS

| | | | |
|---|---|---|---|
| 8,835,314 B2 | 9/2014 | Kim | |
| 2009/0035584 A1* | 2/2009 | Tran | H01L 21/0337 428/446 |
| 2010/0155959 A1* | 6/2010 | Park | H01L 21/0337 257/773 |
| 2011/0250757 A1 | 10/2011 | Sukekawa et al. | |
| 2011/0318931 A1* | 12/2011 | Min | H01L 21/0337 438/696 |
| 2012/0156883 A1* | 6/2012 | Choi | H01L 21/0337 438/703 |
| 2012/0171867 A1* | 7/2012 | Kim | H01L 21/3086 438/702 |
| 2013/0034963 A1 | 2/2013 | Chung et al. | |
| 2013/0196477 A1 | 8/2013 | Kang | |
| 2013/0209941 A1 | 8/2013 | Motoike et al. | |
| 2013/0214413 A1 | 8/2013 | Lee et al. | |
| 2014/0154885 A1* | 6/2014 | Sim | H01L 21/0337 438/696 |
| 2014/0256093 A1* | 9/2014 | Lin | H01L 21/82343 438/157 |

FOREIGN PATENT DOCUMENTS

| | | |
|---|---|---|
| JP | 2013-164509 | 8/2013 |
| KR | 1020130015145 | 2/2013 |
| KR | 1020130070351 | 6/2013 |
| KR | 1020130095640 | 8/2013 |

* cited by examiner

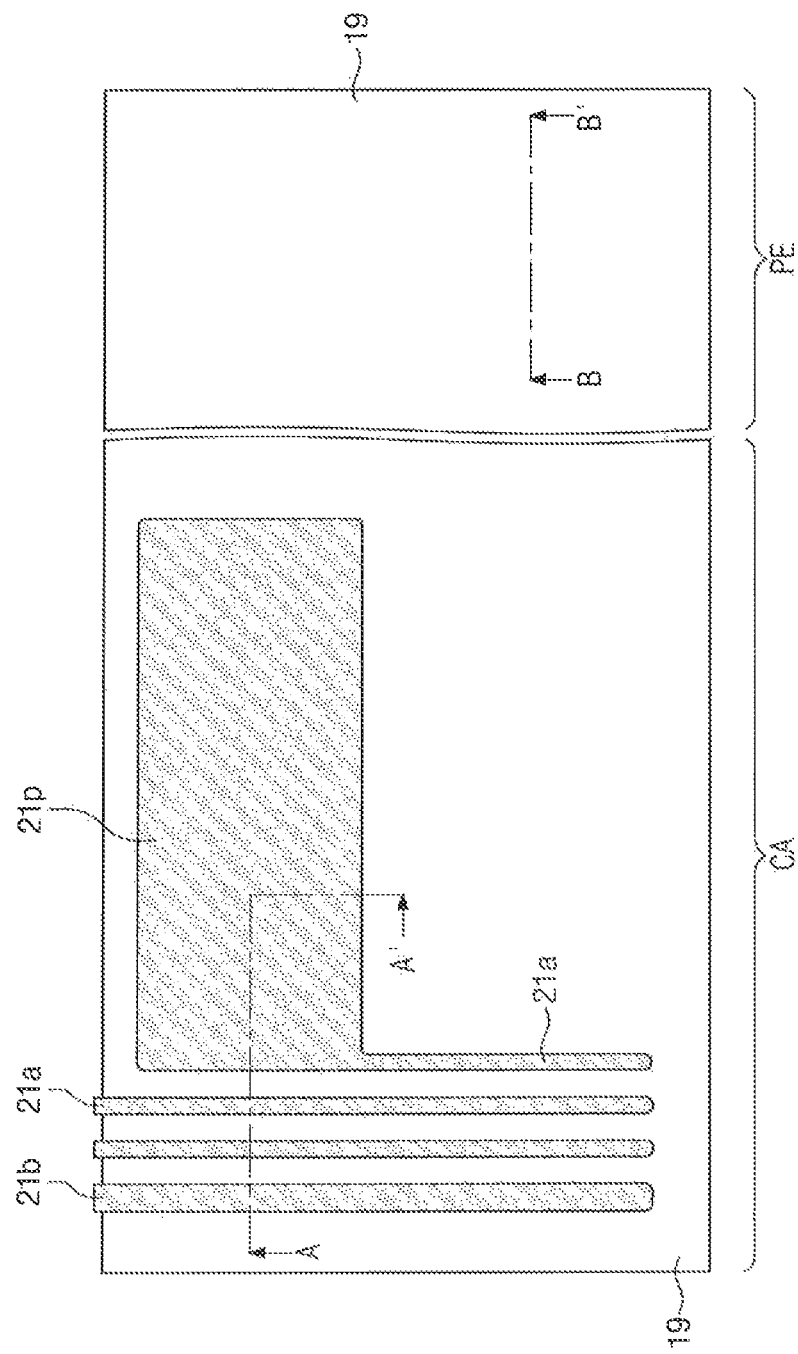

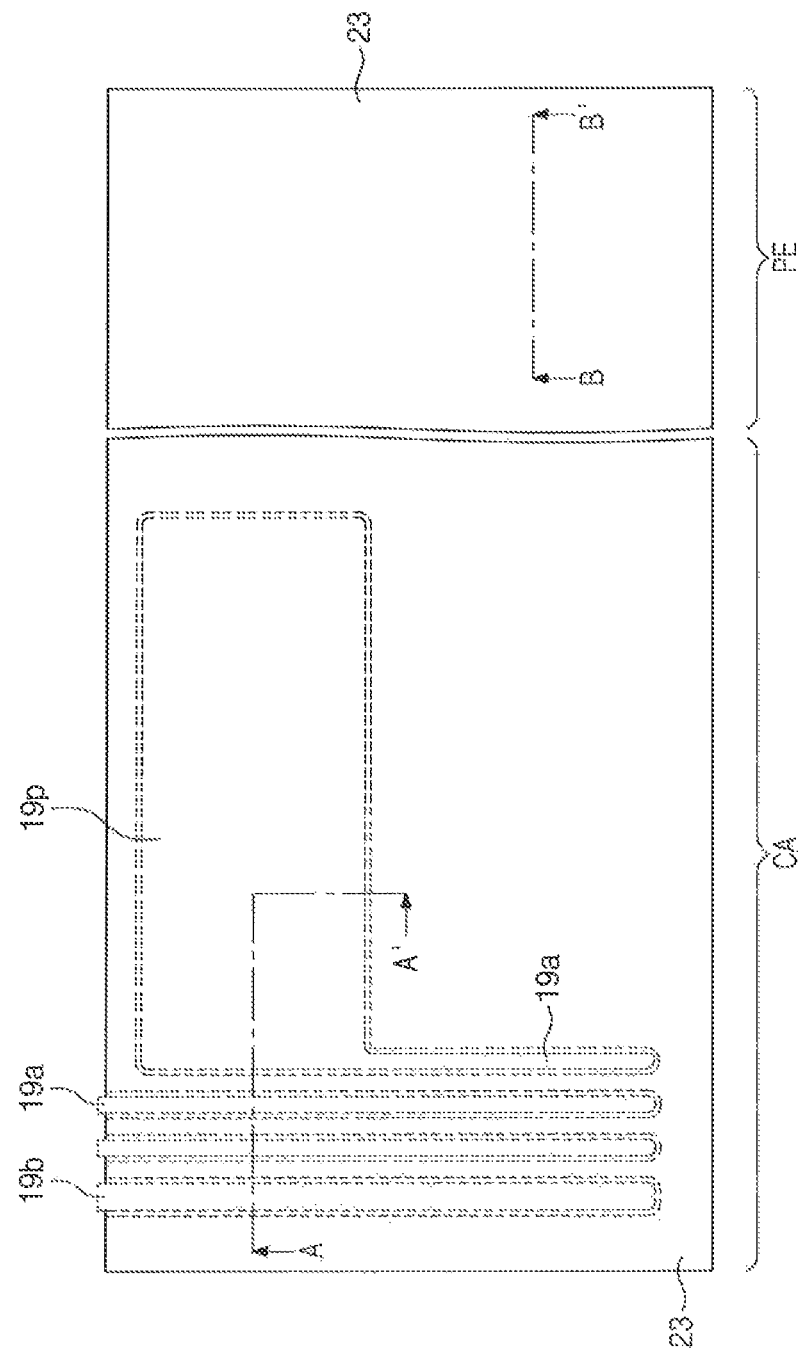

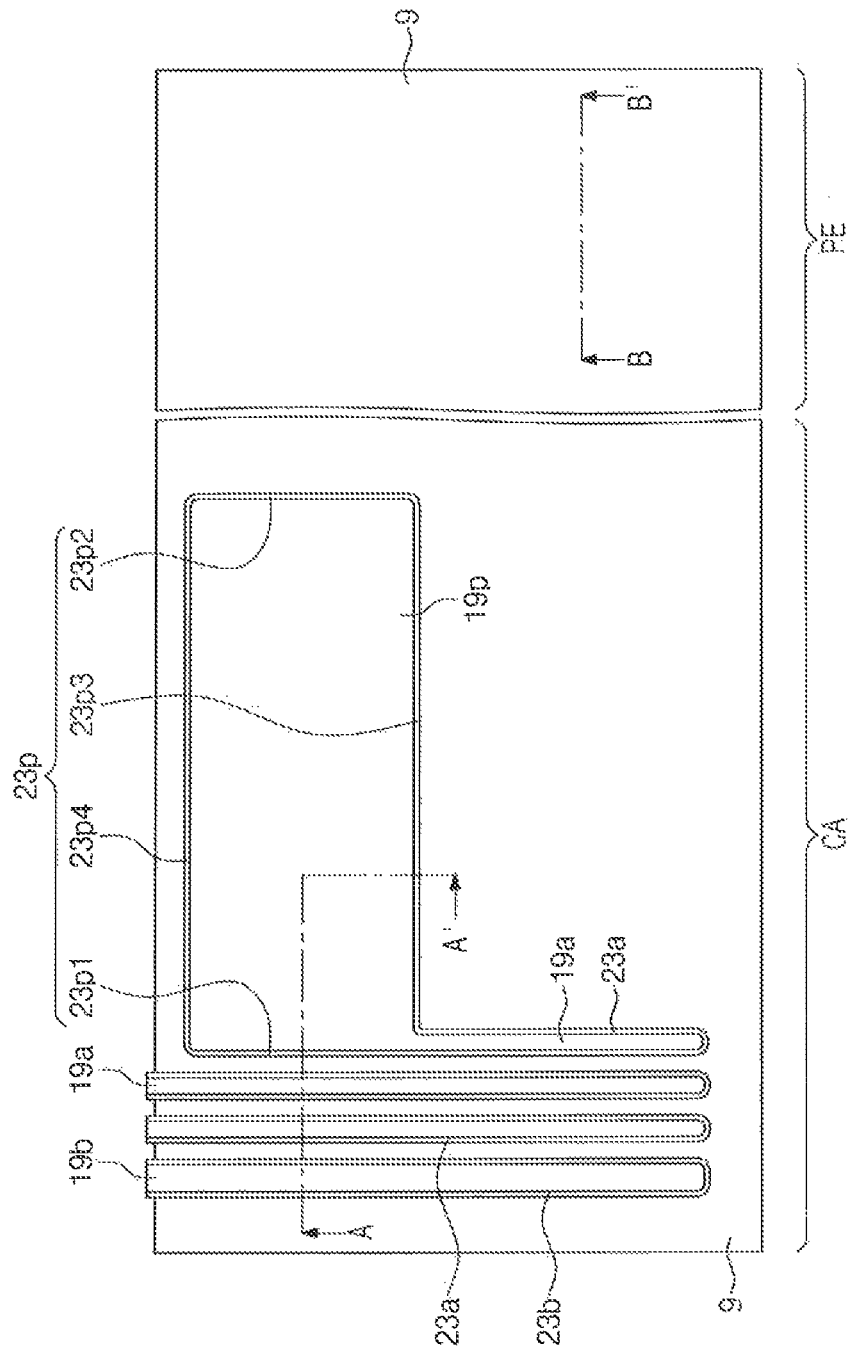

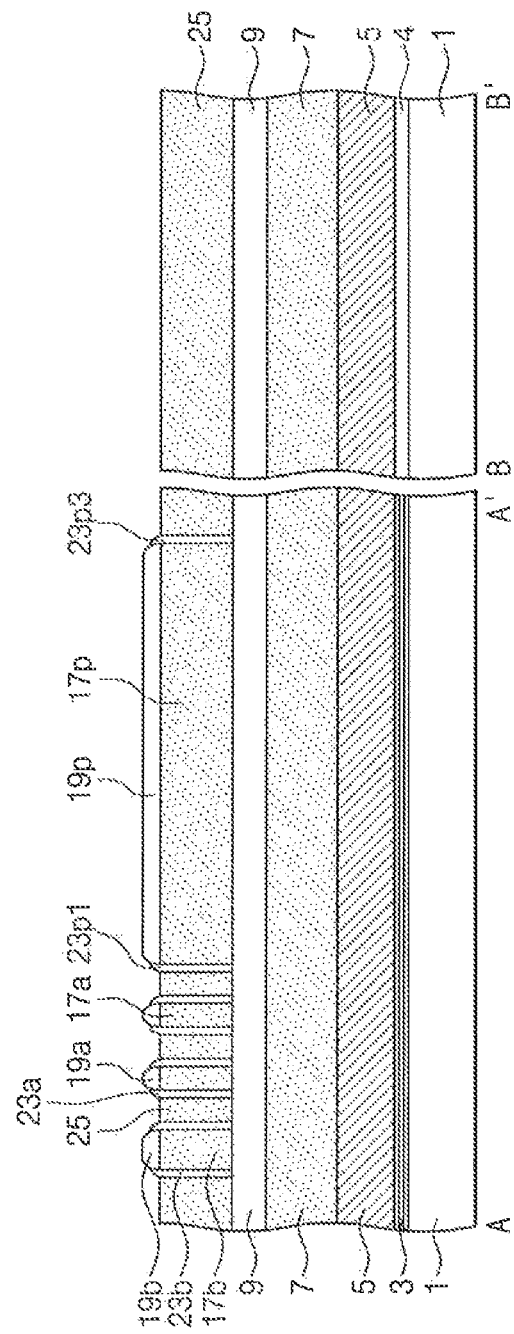

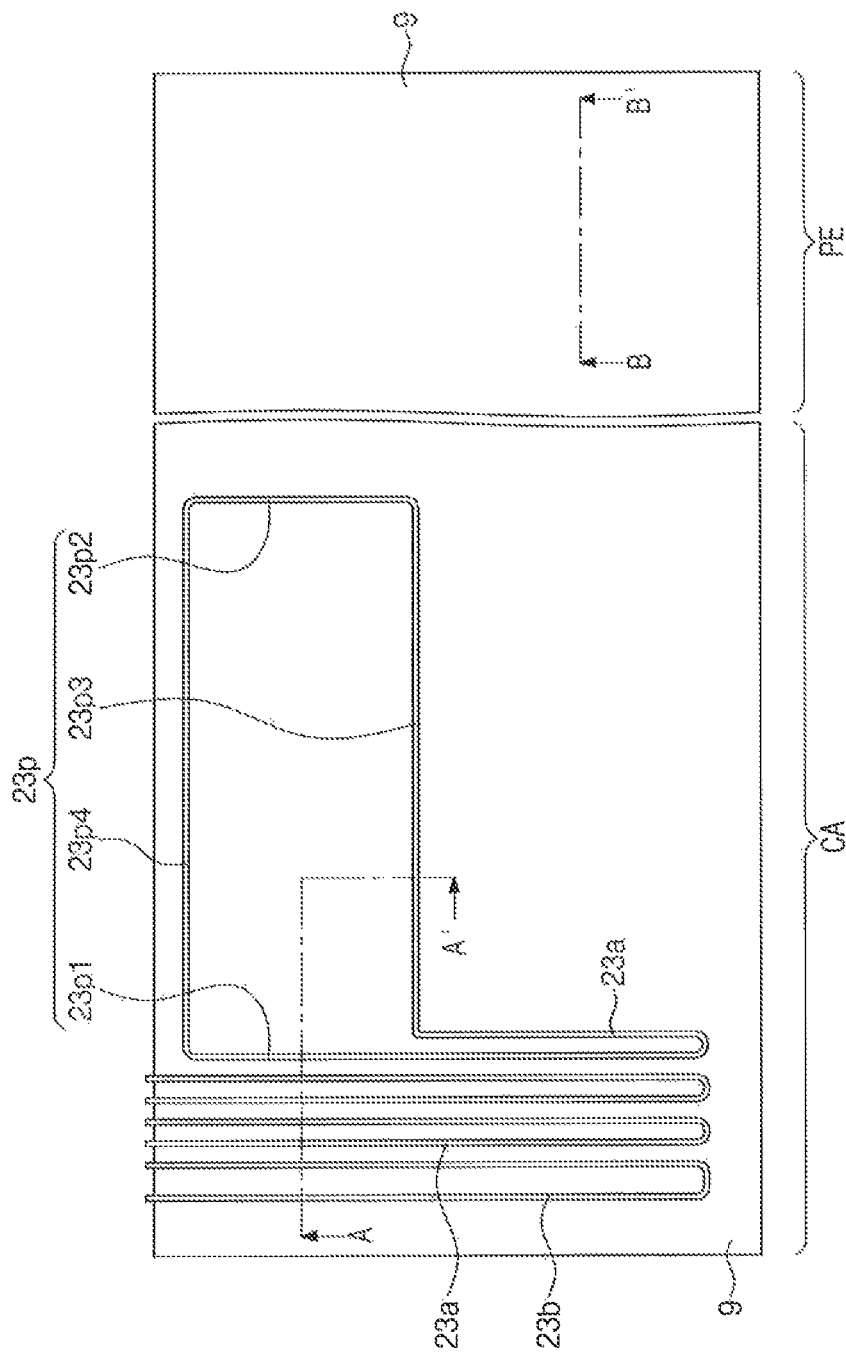

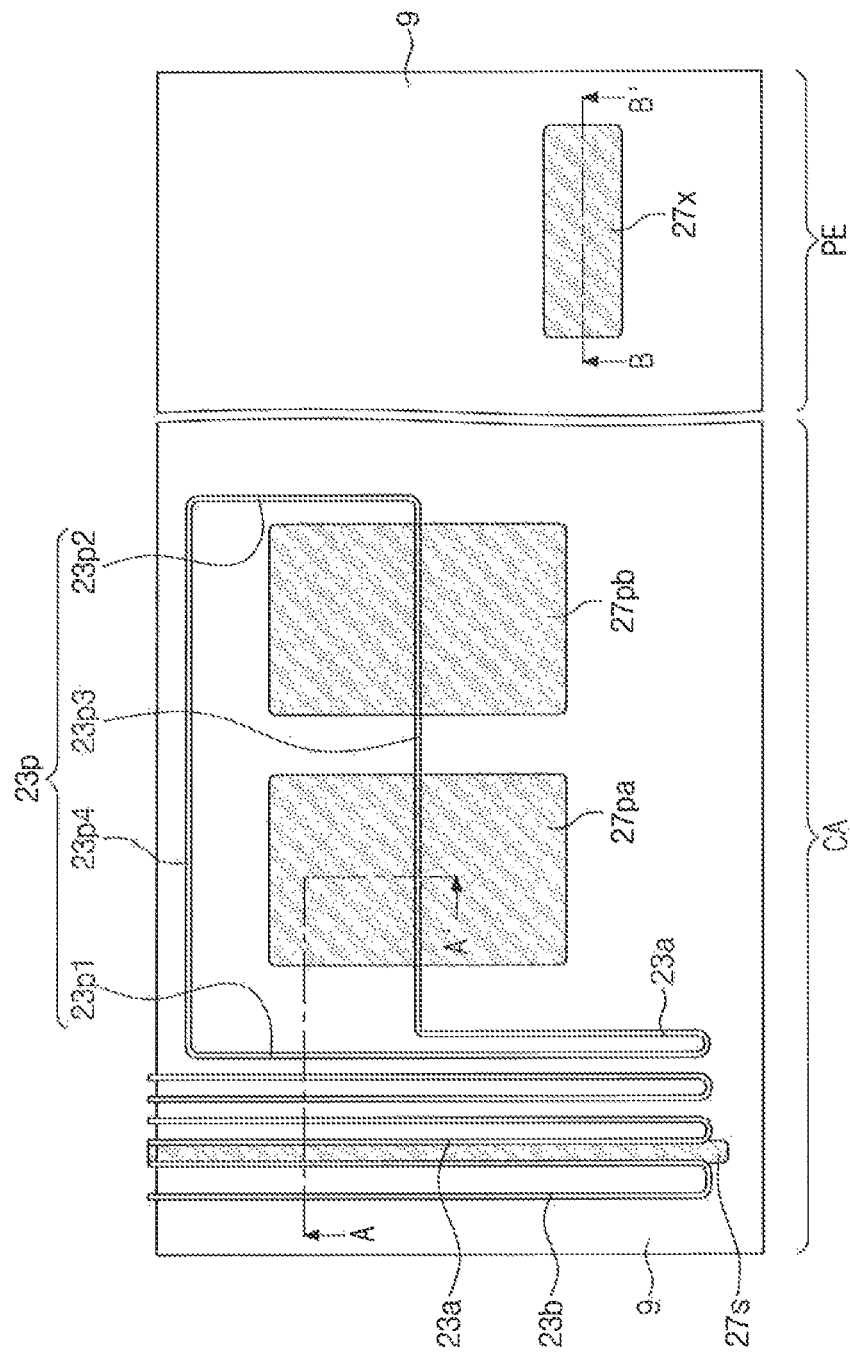

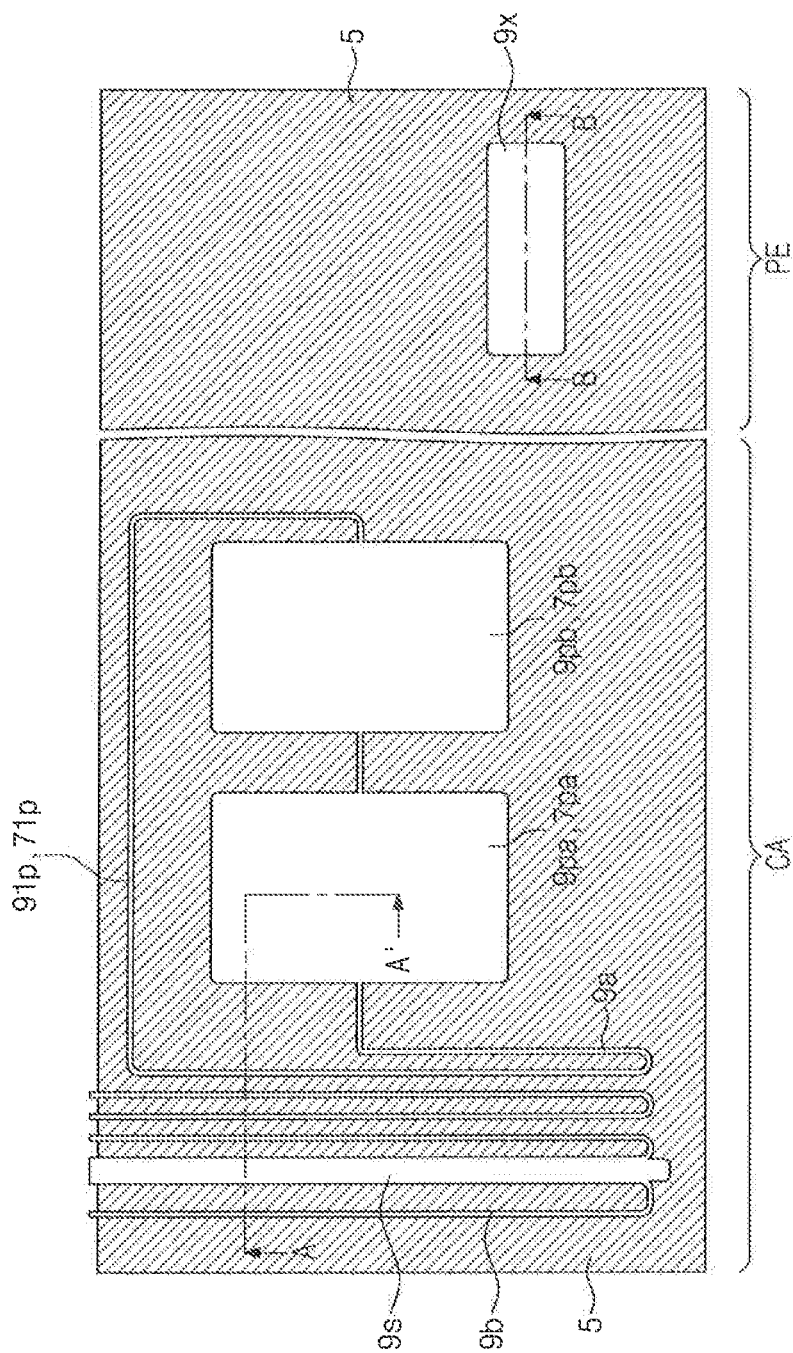

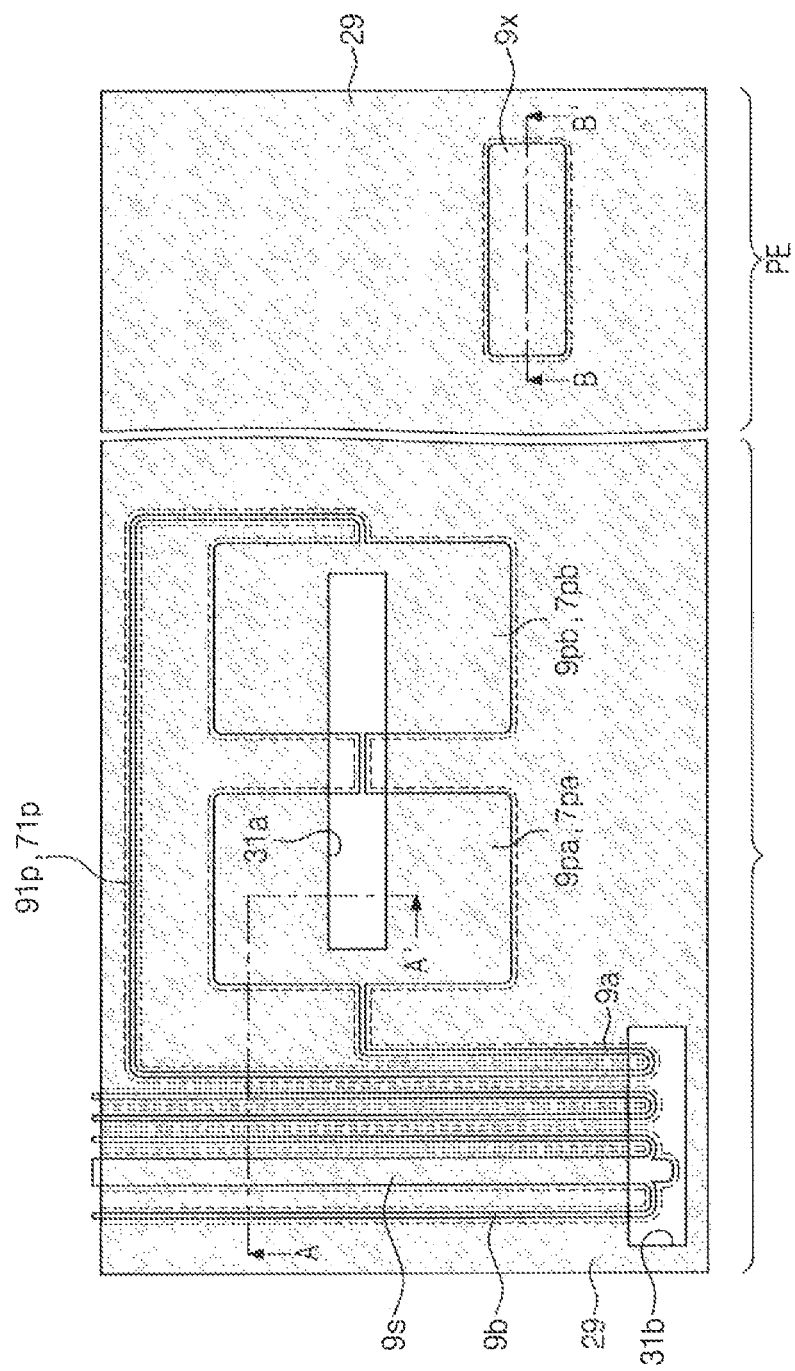

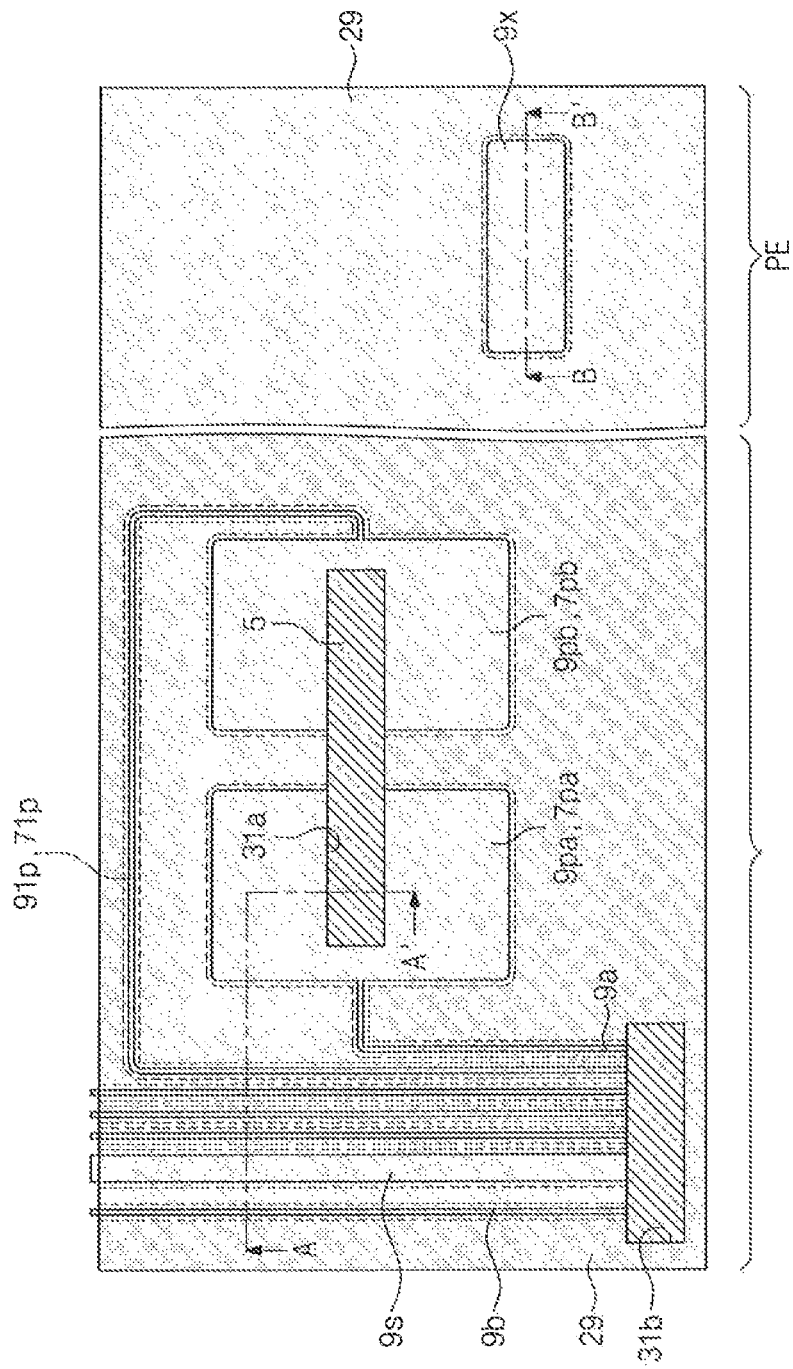

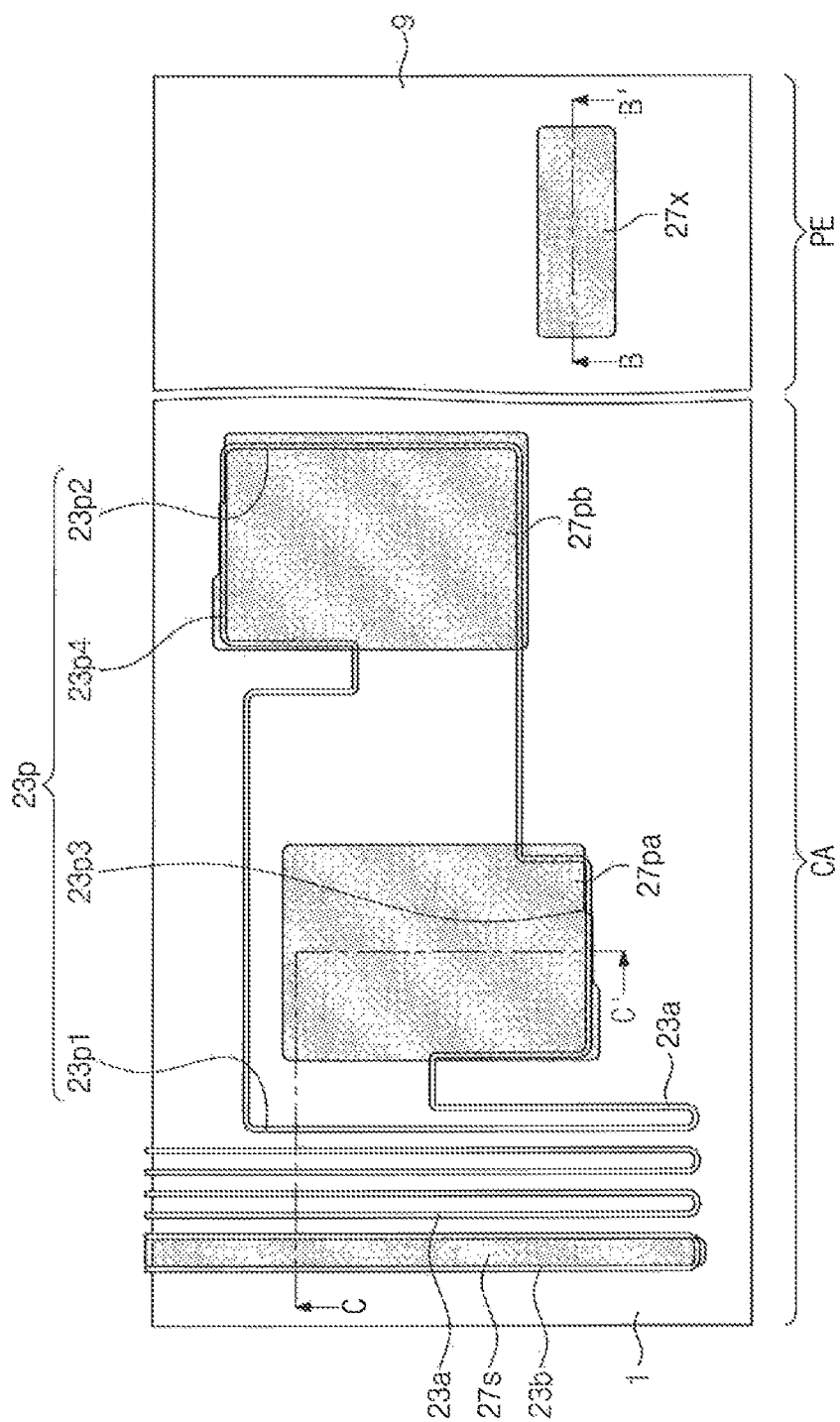

METHOD OF FABRICATING A SEMICONDUCTOR DEVICE AND A SEMICONDUCTOR DEVICE FABRICATED BY THE METHOD

CROSS-REFERENCE TO RELATED APPLICATION

This U.S. non-provisional patent application claims priority under 35 U.S.C. §119 to Korean Patent Application No. 10-2014-0055685, filed on May 9, 2014, in the Korean Intellectual Property Office, the disclosure of which is incorporated by reference herein in its entirety.

TECHNICAL FIELD

Exemplary embodiments of the present inventive concept relate to methods of fabricating a semiconductor device and semiconductor devices fabricated by the methods.

DISCUSSION OF RELATED ART

A double patterning technique may form patterns having a pitch smaller than a minimum pitch defined by an exposure apparatus without having to replace the exposure apparatus with a new one. For example, a spacer may be formed on a sacrificial pattern that is formed using a photolithography process, and then the sacrificial pattern may be removed. An etch target layer may be etched using only the spacer as an etch mask. However, as semiconductor devices are being highly integrated, finer patterns may be employed.

SUMMARY

Exemplary embodiments of the present inventive concept may provide methods of fabricating a semiconductor device that can increase process margins and form fine patterns.

Exemplary embodiments of the present inventive concept may provide semiconductor devices with increased reliability and an integration degree.

A method of fabricating a semiconductor device according to an exemplary embodiment of the present inventive concept includes stacking an etch target layer, a first mask layer, and a second mask layer on a first surface of a substrate. A plurality of first spacer lines are formed parallel to each other and a first spacer pad line on the second mask layer is formed. The first spacer pad line is laterally bent from an end portion of one of the first spacer lines, and the first spacer pad line is spaced apart from the first spacer lines. A third mask pad being in contact with at least the first spacer pad line on the second mask layer is formed. The second mask layer and the first mask layer are etched using the third mask pad, the first spacer lines, and the first spacer pad line as an etch mask to form one or more first mask lines, a first mask preliminary pad connected to one of the first mask lines, and second mask patterns respectively covering top surfaces of the first mask lines and the first mask preliminary pad. Second spacer lines are formed respectively covering sidewalls of the first mask preliminary pad and the first mask lines. A portion of the first mask preliminary pad is removed to form first mask pads separated from each other. The second mask patterns and the first mask lines are removed. The etch target layer is etched using the second spacer lines and the first mask pads as an etch mask to form conductive lines and conductive pads connected to the conductive lines.

In some embodiments, the third mask pad may intersect the first spacer pad line.

In some embodiments, the first spacer lines adjacent to each other and the first spacer pad lines connected thereto may be connected to each other to form a closed-loop. The third mask pad may include third mask pads adjacent to each other. The first space pad line may include first spacer pad lines adjacent to each other. The third mask pads adjacent to each other may be in contact with at least one of the first spacer pad lines adjacent to each other.

In some embodiments, forming the first spacer lines and the first spacer pad line may include forming fourth mask lines and a fourth mask pad connected to an end portion of at least one of the fourth mask lines on the second mask layer. The first spacer lines and the first spacer pad line may be formed respectively covering sidewalls of the fourth mask lines and the fourth mask pad and exposing a top surface of the second mask layer. The fourth mask lines and the fourth mask pad may be removed. A width of each of the fourth mask lines may be equal to or greater than twice a width of the first spacer line.

In some embodiments, a distance between the fourth mask lines may be equal to or greater than three times the width of the first spacer line.

In some embodiments, the method may include forming a protection layer covering sidewalls of the first spacer pad line and the first spacer lines and the exposed top surface of the second mask layer before removing the fourth mask lines and the fourth mask pad. An etch rate of the protection layer may be equal to etch rates of the fourth mask lines and the fourth mask pad.

In some embodiments, at least one sidewall of the third mask pad may be in contact with the first spacer pad line. The third mask pad may have laterally protruding portions of which protruding lengths increase.

In some embodiments, forming second spacer lines respectively covering sidewalls of the first mask preliminary pad and the first mask lines and removing a portion of the first mask preliminary pad to form first mask pads separated from each other may include forming a second spacer layer conformally covering sidewalls of the first mask lines, a sidewall of the first mask preliminary pad, sidewalls of the second mask patterns, top surfaces of the second mask patterns, and a top surface of the etch target layer. A fourth mask pattern may be formed including a first opening. The first opening may overlap a portion of the first mask preliminary pad and may expose the second spacer layer. An anisotropic etching process may be performed to remove the second spacer layer, the second mask pattern, and a portion of the first mask preliminary pad through the first opening. The fourth mask pattern may be removed. A second portion of the first mask preliminary pad may be removed using an isotropic etching process to form the first mask pads separated from each other. The second spacer layer may be anisotropically etched to form the second spacer lines.

In some embodiments, end portions of the first spacer lines adjacent to each other may be connected to each other. The fourth mask pattern may include a second opening overlapping the connected end portions of the first spacer lines. The first spacer lines adjacent to each other may be separated from each other by the anisotropic etching process.

In some embodiments, the first mask pads may include curved sidewalls.

In some embodiments, the method may include forming a third mask selection line filling a space between the first spacer lines adjacent to each other. The first mask layer may be etched using the third mask selection line as an etch mask to form a first mask selection line. A second spacer selection line may be formed covering a sidewall of the first mask selection line. The etch target layer may be etched using the first mask selection line and the second spacer selection line as an etch mask to form a conductive selection line.

In some embodiments, corners of at least one end portion of the conductive selection line may protrude laterally from a central portion of the end portion.

In some embodiments, a thickness of the second mask pattern disposed on the first mask line may be smaller than a thickness of the second mask pattern disposed on the first mask pad.

In some embodiments, the substrate may include a cell array area and a peripheral circuit area. The first spacer lines, the first spacer pad line, and the third mask pad may be formed in the cell array area, and a mask peripheral pattern may be formed on the second mask layer in the peripheral circuit area.

According to an exemplary embodiment of the present inventive concept, a semiconductor device may include at least two conductive lines that are parallel to each other. A conductive pad line is connected to and bent from at least one end portion of at least one of the conductive lines. A conductive pad is connected to the conductive pad line and having a first sidewall that is curved. The conductive pad includes a pad protrusion protruding from at least one corner of the conductive pad, and a width of the pad protrusion may be equal to that of the conductive line.

In some embodiments, the semiconductor device may include a conductive selection line parallel to the conductive lines. A width of the conductive selection line may be greater than that of the conductive line. The conductive selection line may include line protrusions protruding from at least one corner of one end portion of the conductive selection line.

In some embodiments, a width of each of the line protrusions may be equal to that of the conductive line.

In some embodiments, the semiconductor device may include a residual conductive pattern parallel to and spaced apart from the pad protrusion. A width of the residual conductive pattern may be equal to that of the conductive line.

In some embodiments, the conductive pad may include a second sidewall opposite to the first sidewall. The second sidewall may have protruding portions of which protruding lengths increase.

BRIEF DESCRIPTION OF THE DRAWINGS

The above and other features of the present inventive concept will become more apparent by describing in detail exemplary embodiments thereof, with reference to the accompanying drawings in which:

FIGS. 1A, 2A, 3A, 4A, 5A, 6A, 7A, 8A, 9A, 10A, 11A, and 12A are plan views illustrating a method of fabricating a semiconductor device according to an exemplary embodiment of the present inventive concept;

FIGS. 1B, 2B, 3B, 4B, 5B, 6B, 7B, 8B, 9B, 10B, 11B, and 12B are cross-sectional views taken along lines A-A' and B-B' of FIGS. 1A, 2A, 3A, 4A, 5A, 6A, 7A, 8A, 9A, 10A, 11A, and 12A, respectively;

FIGS. 13A, 14A, 15A, 16A, 17A, and 18A are plan views illustrating a method of fabricating a semiconductor device according to an exemplary embodiment of the present inventive concept;

DETAILED DESCRIPTION OF THE EMBODIMENTS

Figure 1B:
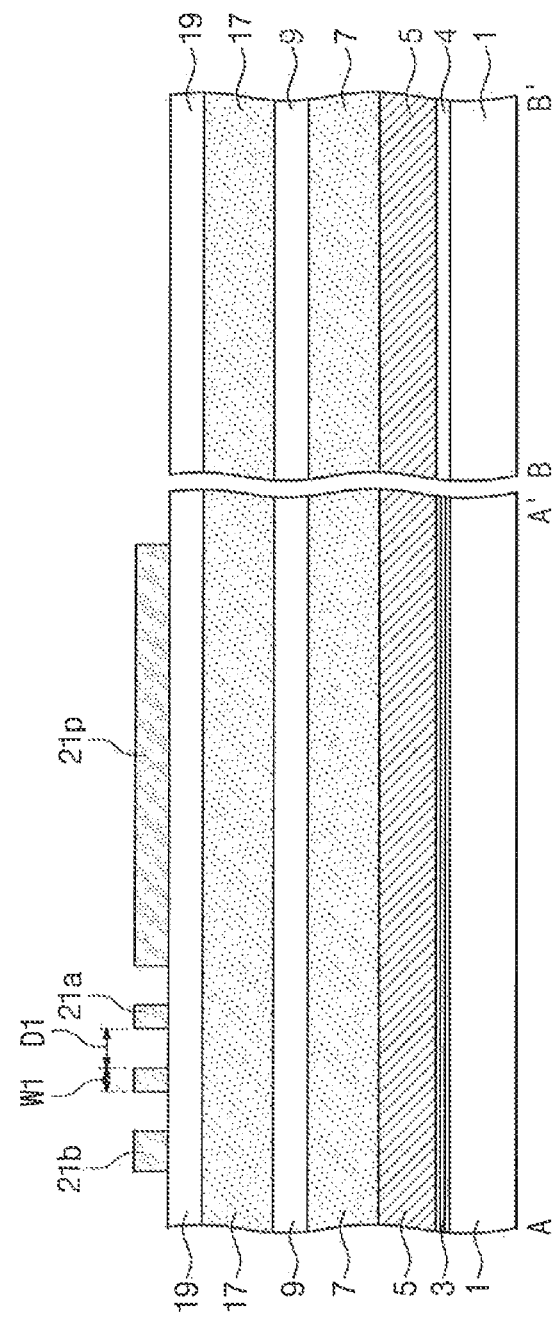

Exemplary embodiments of the present inventive concept will now be described more fully hereinafter with reference to the accompanying drawings, in which exemplary embodiments of the inventive concept are shown. It should be noted, however, that the present inventive concept is not limited to the following exemplary embodiments, and may be implemented in various forms. In the drawings, the sizes and relative sizes of layers and regions may be exaggerated for clarity.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Additionally, shapes of the exemplary views of the present inventive concept may be modified according to manufacturing techniques and/or allowable errors. Therefore, the embodiments of the present inventive concept are not limited to the specific shapes illustrated in the exemplary views, but may include other shapes that may be created according to manufacturing processes. For example, an etching region illustrated as a rectangle may have rounded or curved features.

The same reference numerals or the same reference designators may refer to the same elements throughout the specification and drawings.

Additionally, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern depending on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A data storage layer will be described in the following embodiments. However, exemplary embodiments of the present inventive concept are not limited thereto. In an exemplary embodiment of the present inventive concept, the data storage layer may correspond to a gate dielectric layer. In an exemplary embodiment of the present inventive concept, a tunnel dielectric layer included in the data storage layer may correspond to a gate dielectric layer.

FIGS. 1A, 2A, 3A, 4A, 5A, 6A, 7A, 8A, 9A, 10A, 11A, and 12A are plan views illustrating a method of fabricating a semiconductor device according to an exemplary embodiment of the present inventive concept. FIGS. 1B, 2B, 3B, 4B, 5B, 6B, 7B, 8B, 9B, 10B, 11B, and 12B are cross-sectional views taken along lines A-A' and B-B' of FIGS. FIGS. 1A, 2A, 3A, 4A, 5A, 6A, 7A, 8A, 9A, 10A, 11A, and 12A, respectively.

Referring to FIGS. 1A and 1B, a substrate 1 may be prepared. The substrate 1 may include a cell array area CA and a peripheral circuit area PE. A cell gate dielectric layer 3 may be formed on the substrate 1 in the cell array area CA. A peripheral gate dielectric layer 4 may be formed on the substrate 1 in the peripheral circuit area PE. An etch target layer 5, a first mask layer 7, a second mask layer 9, a third mask layer 17, and a fourth mask layer 19 may be sequentially formed on an entire top surface of the substrate 1. The etch target layer 5 may include a conductive layer. The substrate 1 may be a single-crystalline silicon wafer or a silicon-on-insulator (SOI) substrate. At least the etch target layer 5 may be an etch target. The conductive layer of the etch target layer 5 may include at least one of a poly-silicon layer doped with dopants, a metal silicide layer, or a metal layer. The etch target layer 5 may include a hard mask layer disposed on the conductive layer. The hard mask layer may include at least one of a poly-silicon layer, an oxide layer, or a nitride layer.

The cell gate dielectric layer 3 may be a single-layer or multi-layer including at least one of a silicon oxide layer, a silicon nitride layer, a metal oxide layer. In an exemplary embodiment of the present inventive concept, the cell gate dielectric layer 3 may include a tunnel dielectric layer, a charge storage layer, and a blocking dielectric layer which may be sequentially stacked. In an exemplary embodiment of the present inventive concept, the charge storage layer may be replaced with a floating conductive pattern. The peripheral gate dielectric layer 4 may not include the charge storage layer. In an exemplary embodiment of the present inventive concept, the first and third mask layers 7 and 17 may include a same material. For example, each of the first and third mask layers 7 and 17 may include a spin-on-hard mask (SOH) layer or a spin-on carbon (SOC) layer. In an exemplary embodiment of the present inventive concept, the second and fourth mask layers 9 and 19 may include a same material. For example, each of the second and fourth mask layers 9 and 19 may include a silicon oxynitride layer (SiON). In the cell array area CA, first photoresist patterns 21a, 21b, and 21p may be formed on the fourth mask layer 19.

The first photoresist patterns 21a, 21b, and 21p may include 1a-th photoresist line patterns 21a, 1b-th photoresist line patterns 21b, and first photoresist pad patterns 21p connected to end portions of the photoresist line patterns 21a and 21b. FIG. 1A illustrates the first photoresist pad pattern 21p connected to one of the 1a-th photoresist line patterns 21a. A width of the 1a-th photoresist line patterns 21a may be different from that of the 1b-th photoresist line patterns 21b. The width W1 of the first photoresist line patterns 21b may be equal to or greater than about twice a width (1F) of a word line to be finally formed. A distance DI between the first photoresist patterns 21a, 21b, and 21p adjacent to each other may be equal to or greater than about three times the width (1F) of the word line. A portion of the first photoresist pad pattern 21p may partially define a position of a word line pad to be formed in a subsequent process. The width (1F) of the word line may be smaller than a minimum width of a photoresist pattern that is formed using a photolithography process.

Figure 2B:
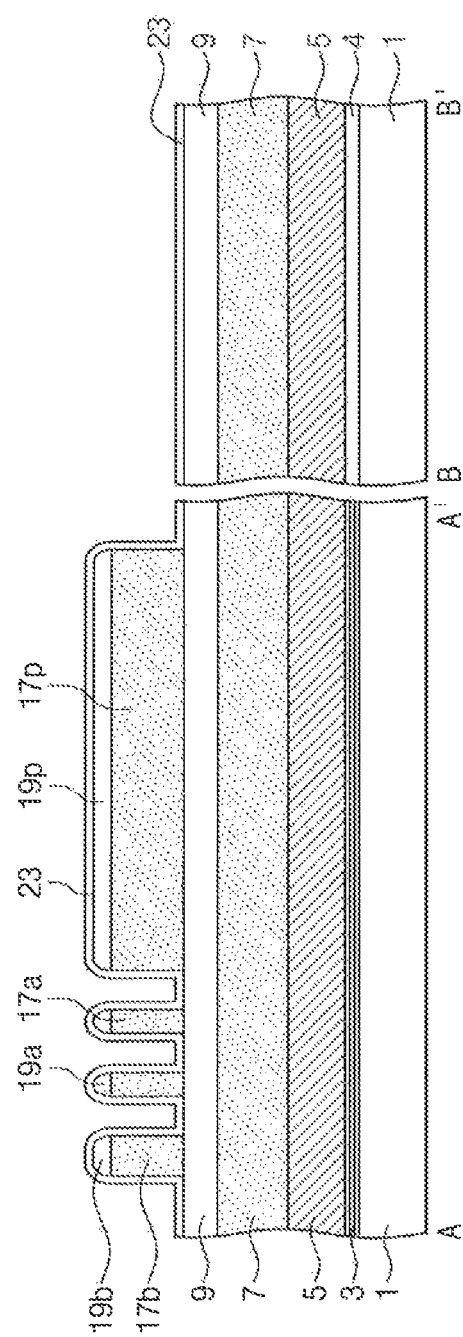

Referring to FIGS. 2A and 2B, the fourth and third mask layers 19 and 17 may be etched using the first photoresist patterns 21a, 21b, and 21p as an etch mask to expose the second mask layer 9, and to form third and fourth mask patterns 17a, 17b, 17p, 19a, 19b, and 19p. The first photoresist patterns 21a, 21b, and 21p may be etched and may be completely removed while the fourth and third mask layers 19 and 17 are etched. The shapes of the first photoresist patterns 21a, 21b, and 21p may be transferred to the third and fourth mask patterns 17a, 17b, 17p, 19a, 19b, and 19p. The fourth mask patterns 19a, 19b, and 19p may include 4a-th mask line patterns 19a, 4b-th mask line patterns 19b, and fourth mask pad patterns 19p which may be disposed at positions corresponding to the 1a-th photoresist line patterns 21a, the 1b-th photoresist line patterns 21b, and the first photoresist pad patterns 21p, respectively. The third mask patterns 17a, 17b, and 17p may include 3a-th mask line patterns 17a, 3b-th mask line patterns 17b, and third mask pad patterns 17p which may be disposed at positions corresponding to the 1a-th photoresist line patterns 21a, the 1b-th photoresist line patterns 21b, and the first photoresist pad patterns 21p, respectively. Thereafter, a first spacer layer 23 may be conformally formed on the entire top surface of the substrate 1. The first spacer layer 23 may include a silicon oxide layer that is formed by, for example, an atomic layer deposition (ALD) method. The first spacer layer 23 may have a thickness that is substantially equal to the width (1F) of the word line.

Figure 3B:
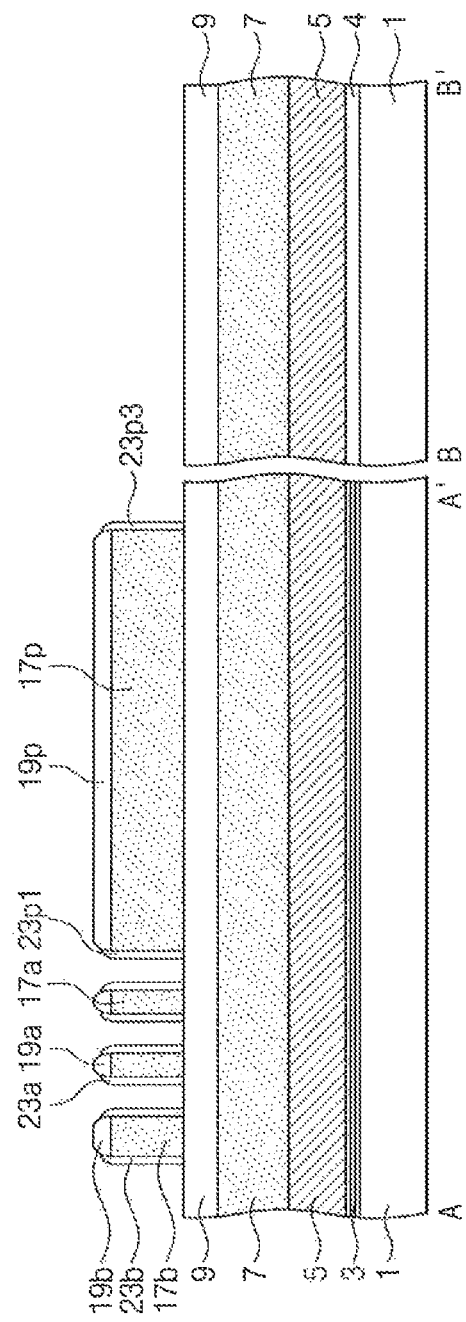

Referring to FIGS. 3A and 3B, the first spacer layer 23 may be anisotropically etched to expose a top surface of the second mask layer 9 and to form first spacer patterns 23a, 23b, and 23p covering sidewalls of the third mask patterns 17a, 17b, and 17p. The first spacer patterns 23a, 23b, and 23p may have a width corresponding to the width (1F) of the word line. The first spacer patterns 23a, 23b, and 23p may include a 1a-th spacer line pattern 23a, a 1b-th spacer line pattern 23b, and a first spacer pad line 23p which may cover the sidewalls of the 3a-th mask line pattern 17a, the 3b-th mask line pattern 17b, and the third mask pad pattern 17p, respectively. The 1a-th spacer line pattern 23a and the first spacer pad line 23p connected thereto may form a closed-loop shape when viewed from a plan view. Even though not shown in the drawings, the 1b-th spacer line pattern 23b and the first spacer pad line 23p connected thereto may form a closed-loop shape when viewed from a plan view. The first spacer pad line 23p may include a first pad line 23p1, a second pad line 23p2, a third pad line 23p3, and a fourth pad line 23p4. The first pad line 23p1 may extend from the 1a-th spacer line pattern 23a in a direction parallel to the 1a-th spacer line pattern 23a. The third pad line 23p3 may extend in a direction perpendicular to the 1a-th spacer line pattern 23a. The second pad line 23p2 may be connected to the third pad line 23p3 and may be parallel to the first pad line 23p1. The fourth pad line 23p4 may be connected to the first and second pad lines 23p1 and 23p2 and may be parallel to the third pad line 23p3.

Figure 4A:
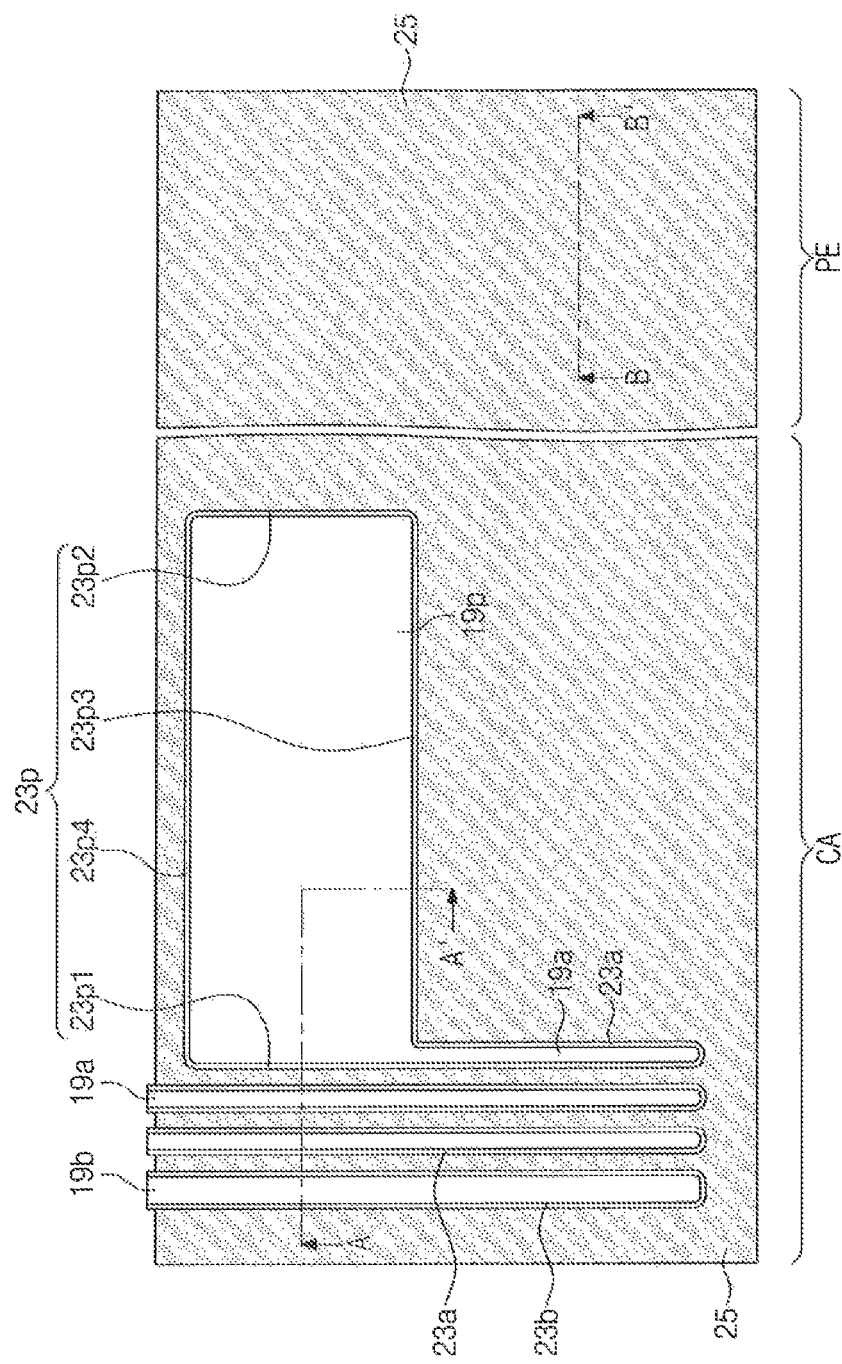

Referring to FIGS. 4A and 4B, a protection layer 25 may be formed to fill spaces between the first spacer patterns 23a, 23b, and 23p in the state that the sidewalls of the third mask patterns 17a, 17b, and 17p may be covered with the first spacer patterns 23a, 23b, and 23p. In an exemplary embodiment of the present inventive concept, the protection layer 25 may include the same material as the third mask patterns 17a, 17b, and 17p. For example, the protection layer 25 may include a SOH layer or a SOC layer. The protection layer 25 may be formed by a coating process and an etch-back process. A height of a top surface of the protection layer 25 may be similar to a height of top surfaces of the third mask patterns 17a, 17b, and 17p. Upper portions of the fourth mask patterns 19a, 19b, and 19p and upper portions of the first spacer patterns 23a, 23b, and 23p may be exposed.

Figure 5B:
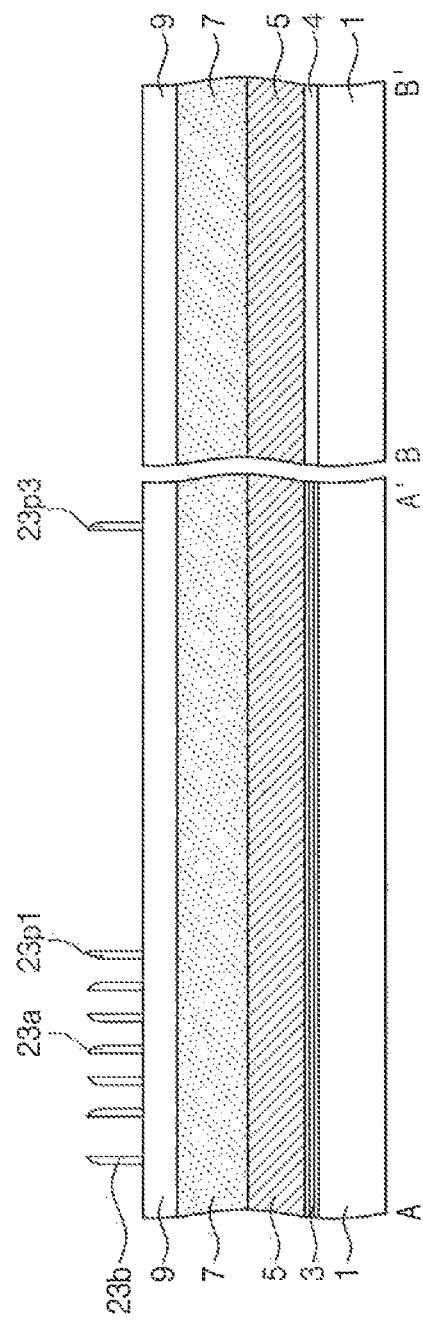

Referring to FIGS. 5A and 5B, the fourth mask patterns 19a, 19b, and 19p may be removed to expose the third mask patterns 17a, 17b, and 17p. Subsequently, the third mask patterns 17a, 17b, and 17p and the protection layer 25 may be removed. The protection layer 25 may protect the second mask layer 9 during an etching process removing the fourth mask patterns 19a, 19b, and 19p. When the protection layer 25 is omitted, an upper portion of the second mask layer 9 disposed outside the close-loops of the first spacer patterns 23a, 23b, and 23p may be partially removed when the fourth mask patterns 19a, 19b, and 19p are removed. A height difference may occur between the second mask layer 9 disposed inside the closed-loops of the first spacer spacers 23a, 23b, and 23p and the second mask layer 9 disposed outside the closed-loops, and defects may occur in a subsequent patterning process. Defects may be prevented by the protection layer 25. Inner sidewalls of the first spacer patterns 23a, 23b, and 23p may be exposed by the removal of the protection layer 25. Distances between the first spacer patterns 23a, 23b, and 23p may be equal to or greater than three times the thickness of the first spacer patterns 23a, 23b, and 23p (e.g., three times the width (1F) of the word line).

In an exemplary embodiment of the present inventive concept, the process of forming the protection layer 25 may be omitted.

Figure 6B:
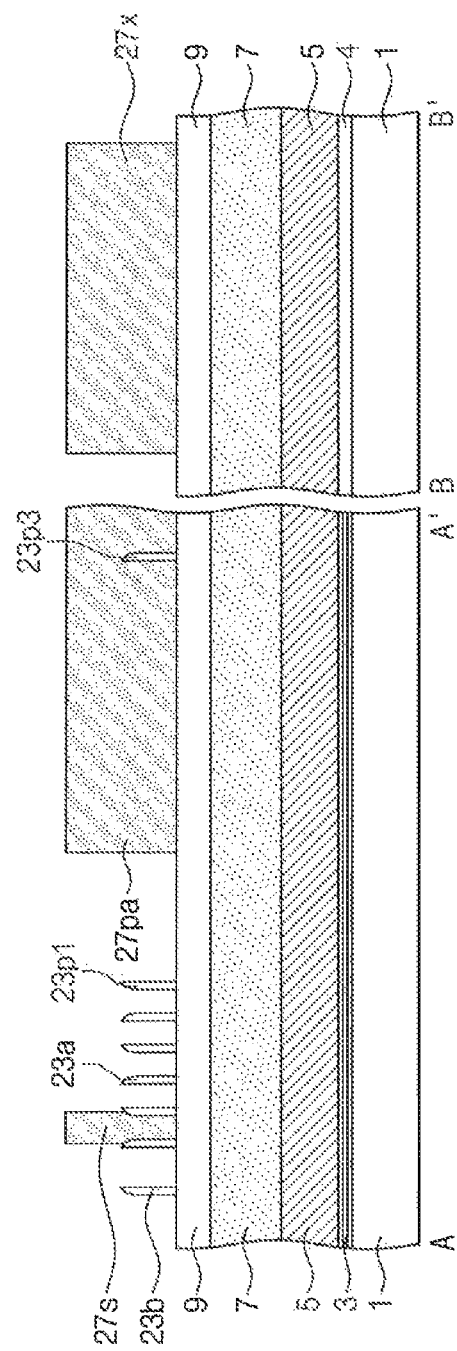

Referring to FIGS. 6A and 6B, second photoresist patterns 27s, 27pa, 27pb, and 27x may be formed on the second mask layer 9. The second photoresist patterns 27s, 27pa, 27pb, and 27x may include a second photoresist selection line pattern 27s defining a string selection line or ground selection line, a 2a-th photoresist pad patterns 27pa, a 2b-th photoresist pad patterns 27pb, and a second photoresist peripheral pattern 27x defining a peripheral circuit gate electrode. The 2a-th photoresist pad patterns 27pa and the 2b-th photoresist pad patterns 27pb may be spaced apart from each other. In an exemplary embodiment of the present inventive concept, the second photoresist selection line pattern 27s may fill a space between the 1a-th spacer line patterns 23a and the 1b-th spacer line patterns 23b that may be adjacent to each other. However, exemplary embodiments of the present inventive concept are not limited thereto. In an exemplary embodiment of the present inventive concept, the second photoresist selection line pattern 27s may fill an inside empty space of the closed-loop of the 1b-th or 1a-th spacer line patterns 23b or 23a, or a space between the 1a-th spacer line patterns 23a adjacent to each other. Distances between the first spacer patterns 23a, 23b, and 23p may be equal to or greater than three times the width (1F) of the word line. In other words, when the distance between first spacer patterns 23a, 23b, and 23p are relatively wide, a process margin of a photolithography process for forming the second photoresist selection line pattern 27s may be increased.

The 2a-th photoresist pad patterns 27pa and the 2b-th photoresist pad patterns 27pb may be formed to intersect a portion of the first spacer pad line 23p. The 2a-th photoresist pad patterns 27pa and the 2b-th photoresist pad patterns 27pb may intersect the third pad line 23p3, which may extend in the direction bent from the 1a-th spacer line patterns 23a, of the first spacer pad line 23p. Thus, even when slight mask misalignment occurs during the formation of the 2a-th and 2b-th photoresist pad patterns 27pa and 27pb, it the occurrence of a disconnection defect may be reduced or prevented between a conductive pad and a conductive line that are to be formed in a subsequent process. In other words, a process margin of the process for forming the second photoresist patterns 27s, 27pa, 27pb, and 27x may be increased. The 2a-th photoresist pad patterns 27pa and the 2b-th photoresist pad patterns 27pb may not be in contact with the first, second, and fourth pad lines 23p1, 23p2, and 23p4.

Figure 7B:
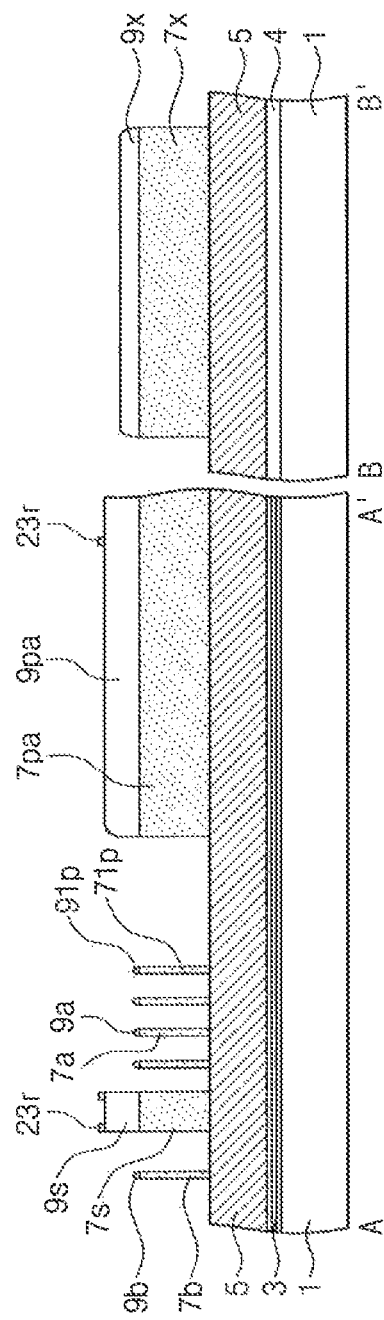

Referring to FIGS. 7A and 7B, the second mask layer 9 and the first mask layer 7 may be etched using the second photoresist patterns 27s, 27pa, 27pb, and 27x and the first spacer patterns 23a, 23b, and 23p as an etch mask to expose the etch target layer 5 and to form second mask patterns 9b, 9s, 9a, 9pa, 9pb, 91p, and 9x and first mask patterns 7b, 7s, 7a, 7pa, 7pb, 71p, and 7x respectively disposed under the second mask patterns 9b, 9s, 9a, 9pa, 9pb, 91p, and 9x. The second photoresist patterns 27s, 27pa, 27pb, and 27x may be etched and then removed during the process of etching the second mask layer 9 and the first mask layer 7. Portions 23r of the first spacer patterns 23a, 23b, and 23p may remain on the second mask patterns 9s, 9pa, and 9pb. The second mask patterns 9b, 9s, 9a, 9pa, 9pb, 91p, and 9x may include a 2a-th mask line pattern 9a, a 2b-th mask line pattern 9b, a second mask selection line pattern 9s, a second mask pad line pattern 91p, a 2a-th mask pad pattern 9pa, a 2b-th mask pad pattern 9pb, and a second mask peripheral pattern 9x. An end portion of the second mask selection line pattern 9s may be connected to end portions of the 2a-th and 2b-th mask line patterns 9a and 9b adjacent to the second mask selection line pattern 9s. The first mask patterns 7b, 7s, 7a, 7pa, 7pb, 71p, and 7x may include a 1a-th mask line pattern 7a, a 1b-th mask line pattern 7b, a first mask selection line pattern 7s, a first mask pad line pattern 71p (e.g. first mask preliminary pad), a 1a-th mask pad pattern 7pa, a 1b-th mask pad pattern 7pb, and a first mask peripheral pattern 7x. An end portion of the first mask selection line pattern 7s may be connected to end portions of the 1a-th and 1b-th mask line patterns 7a and 7b adjacent to the first mask selection line pattern 7s.

Figure 8B:
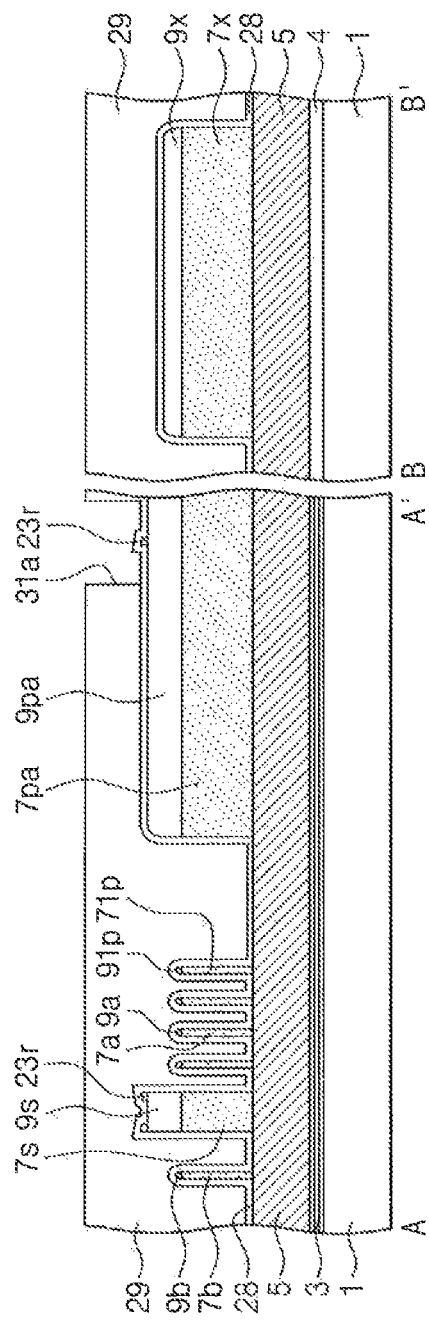

Referring to FIGS. 8A and 8B, a second spacer layer 28 may be conformally formed on the entire top surface of the substrate 1. A third photoresist pattern 29 may be formed on the second spacer layer 28. The third photoresist pattern 29 may include a first opening 31a and a second opening 31b that expose portions of the second spacer layer 28. The first opening 31a may overlap with portions of the 2a-th and 2b-th mask pad patterns 9pa and 9pb adjacent to each other and the second mask pad line pattern 91p connected thereto. The second opening 31b may overlap with end portions of the 2a-th mask line pattern 9a, the 2b-th mask line pattern 9b, and the second mask selection line pattern 9s.

Figure 9B:
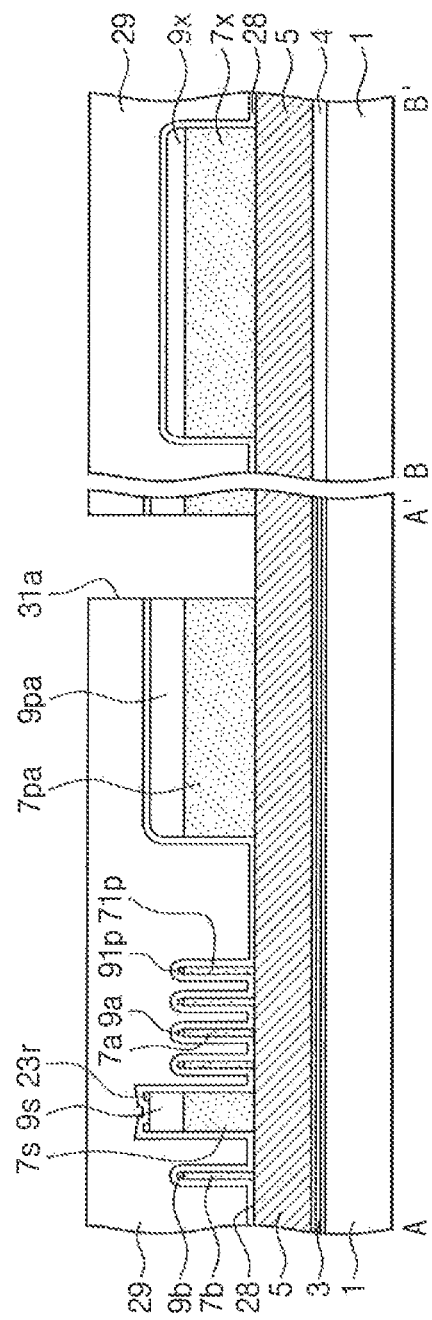

Referring to FIGS. 9A and 9B, an anisotropic etching process may be performed using the third photoresist pattern 29 as an etch mask to remove the second spacer layer 28, the second mask patterns 9pa, 9pb, 91p, 9s, 9a, and 9b, and the first mask patterns 7pa, 7pb, 71p, 7s, 7a, and 7b through the first and second openings 31a and 31b. Thus, the etch target layer 5 under the openings 31a and 31b may be exposed. The first and second openings 31a and 31b may extend downward to the top surface of the etch target layer 5. In other words, shapes of the first and second openings 31a and 31b may be transferred to the second spacer layer 28, the second mask patterns 9pa, 9pb, 91p, 9s, 9a, and 9b, and the first mask patterns 7pa, 7pb, 71p, 7s, 7a, and 7b by the anisotropic etching process. The 2a-th mask line pattern 9a, the 2b-th mask line pattern 9b, and the second mask selection line pattern 9s may be separated from each other. The 1a-th mask line pattern 7a, the 1b-th mask line pattern 7b, and the second mask selection line pattern 7s may be separated from each other. The portions of the 2a-th and 2b-th mask pad patterns 9pa and 9pa adjacent to each other and the second mask pad line pattern 91p connected thereto may be removed by the anisotropic etching process. Portions of the 1a-th and 1b-th mask pad patterns 7pa and 7pb and a portion of the first mask pad line pattern 71p that are disposed under the first opening 31a may also be removed by the anisotropic etching process.

Figure 10A:
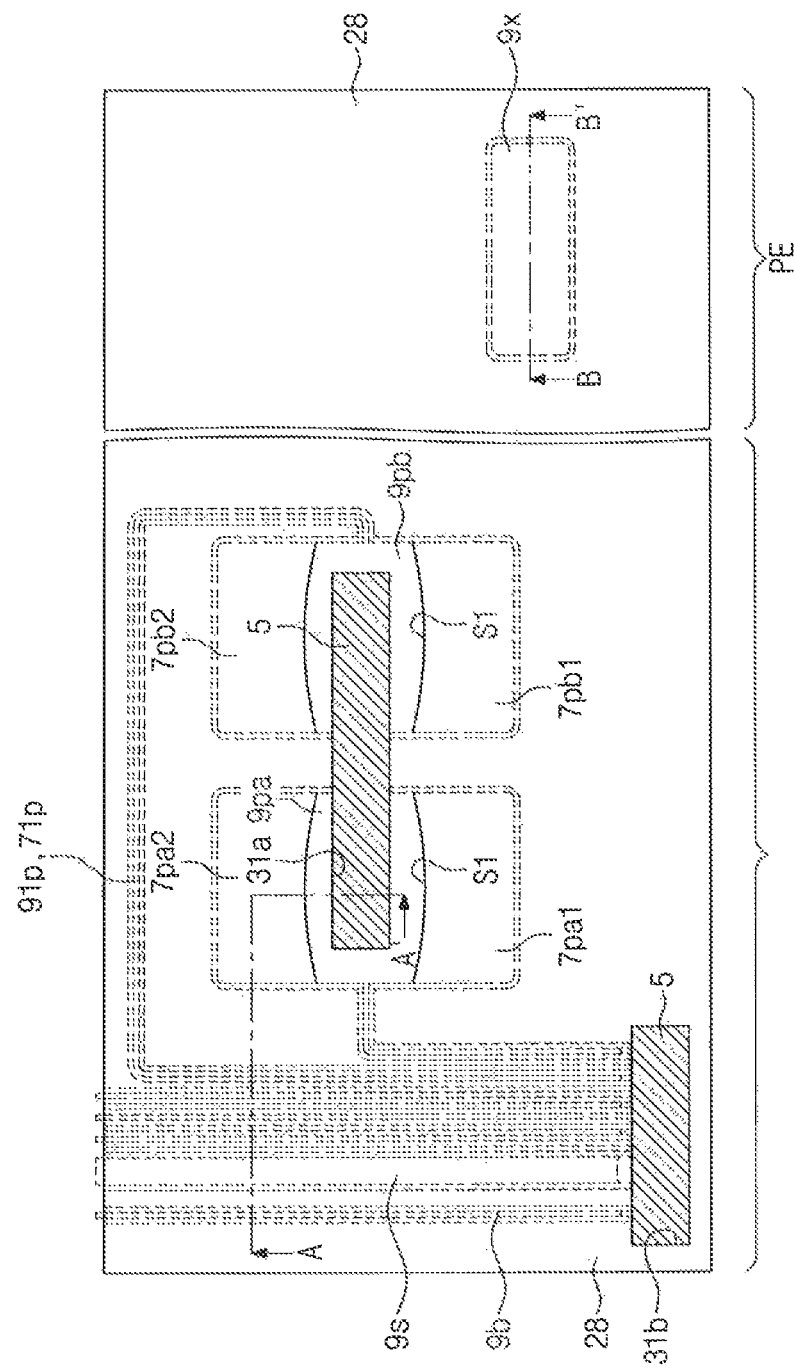
Figure 10B:
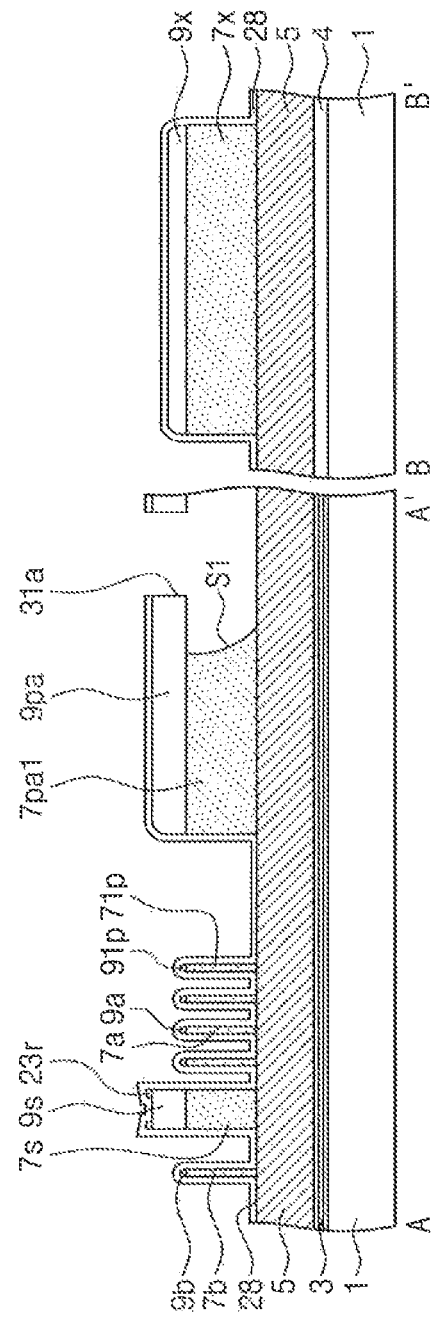

Referring to FIGS. 10A, 10B, 1IA, and 11B, the third photoresist pattern 29 may be removed to expose the second spacer layer 28. An isotropic etching process may be performed to partially remove the first mask patterns 7pa, 7pb, 71p, 7s, 7a, and 7b through the first and second openings 31a and 31b. Thus, the 1a-th mask pad pattern 7pa may be divided into a 1aa-th mask pattern 7pa1 and a 1ab-th mask pattern 7pa2 separated from each other, and the 1b-th mask pad pattern 7pb may be divided into a 1ba-th mask pattern 7pb1 and a 1bb-th mask pattern 7pb2 separated from each other. Sidewalls S1 of the 1aa-th mask pattern 7pa1, the 1ab-th mask pattern 7pa2, the 1ba-th mask pattern 7pb1, and the 1bb-th mask pattern 7pb2 may be formed to be curved by the isotropic etching process. An end portion of the first mask selection line pattern 7s may be partially removed by the isotropic etching process.

Figure 11A:
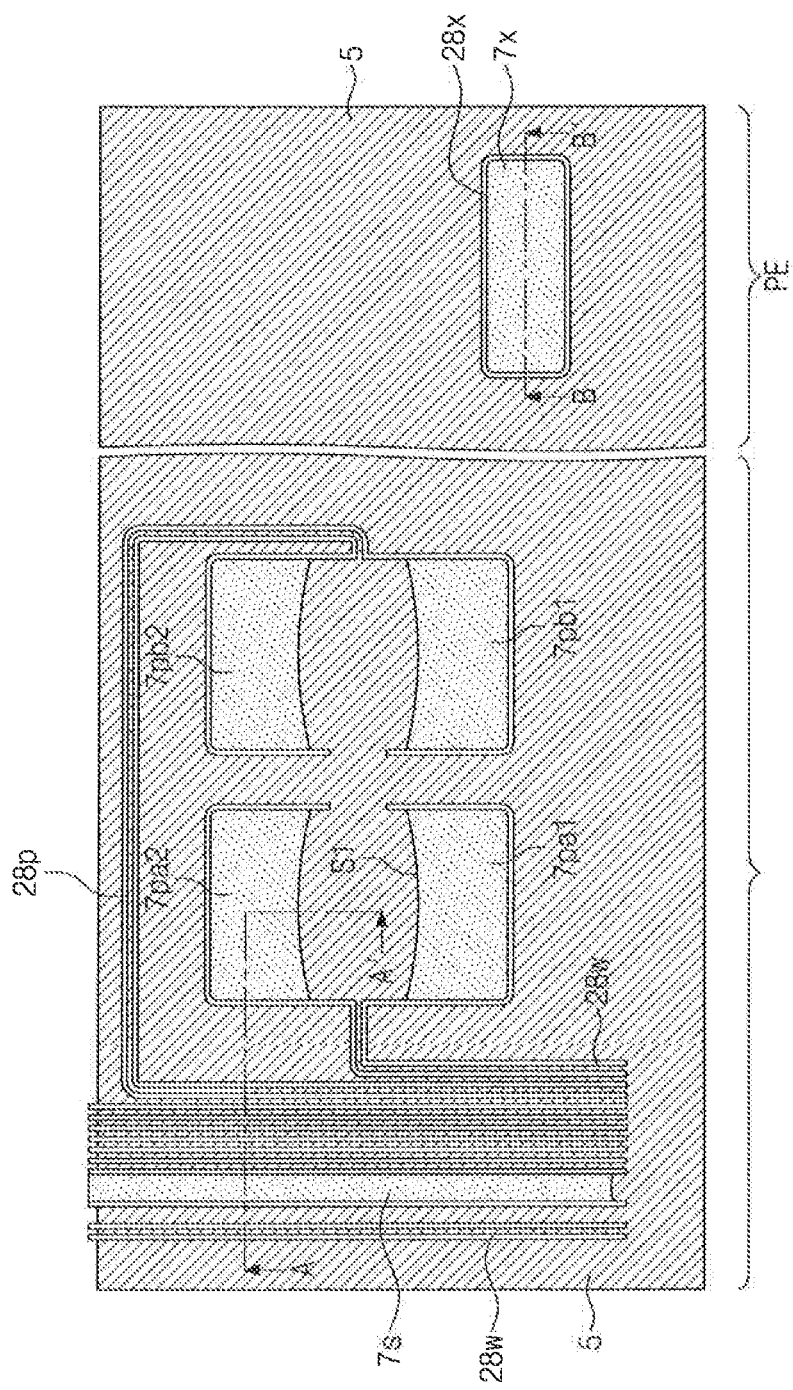
Figure 11B:
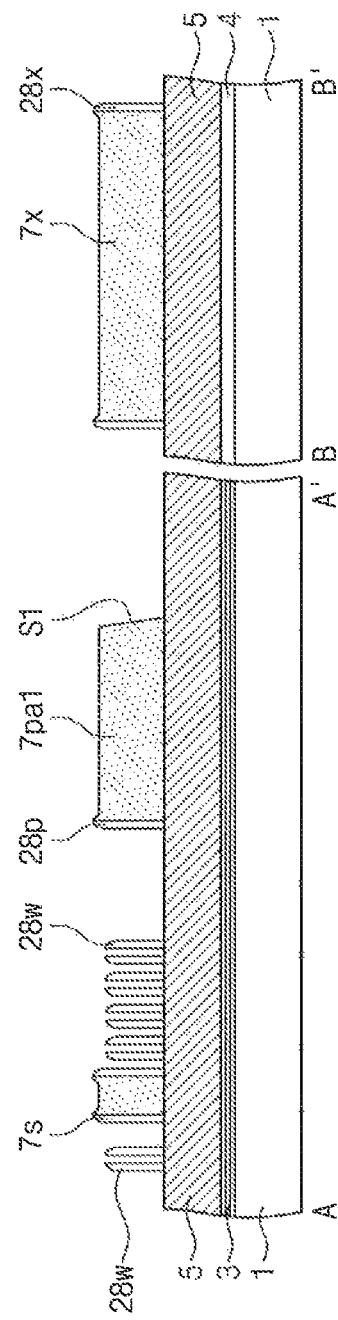

Referring to FIGS. 11A and 11B, an anisotropic etching process may be performed on the second spacer layer 28 to form second spacer patterns 28w, 28p, and 28x. The second spacer patterns 28w, 28p, and 28x may include second spacer line patterns 28w covering sidewalls of the 1a-th mask line pattern 7a, the 1b-th mask line pattern 7b and the first mask selection line pattern 7s; second spacer pad line patterns 28p covering sidewalls of the first mask pad line pattern 71p, the 1a-th mask pad pattern 7pa and the 1b-th mask pad pattern 7pb; and a second spacer peripheral pattern 28x covering a sidewall of the first mask peripheral pattern 7x. An anisotropic etching process may be performed to remove the second mask patterns 9pa, 9pb, 91p, 9s, 9a, and 9b. When the 2a-th and 2b-th mask line patterns 9a and 9b and the second mask pad line pattern 91p are relatively thin, the 1a-th and 1b-th mask line patterns 7a and 7b and the first mask pad line pattern 71p disposed thereunder may be removed. Thus, the second spacer patterns 28w, 28p, and 28x and the first mask patterns 7s, 7pa1, 7pa2, 7pb1, 7pb2, and 7x of which widths may be greater than those of patterns 28w, 28p, and 28x may remain on the etch target layer 5.

Figure 12A:
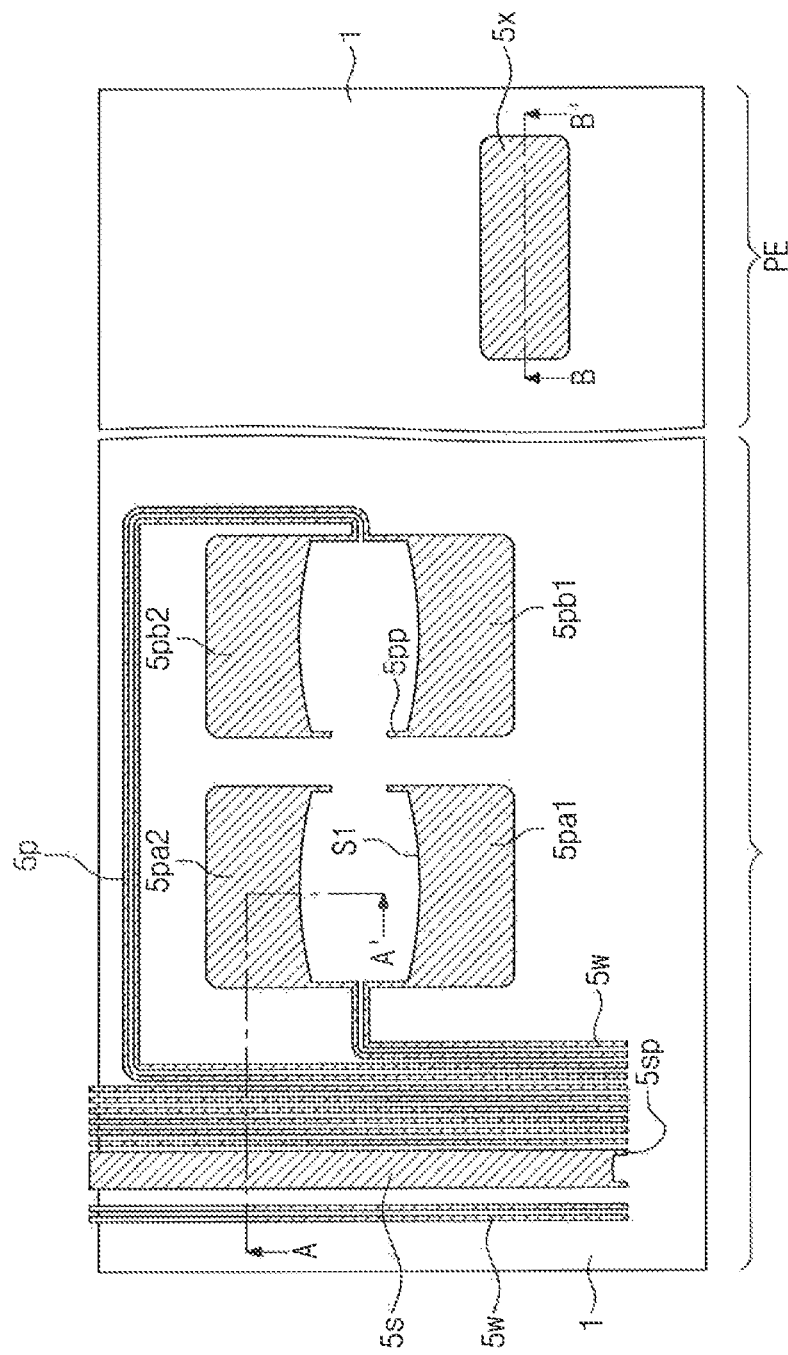
Figure 12B:
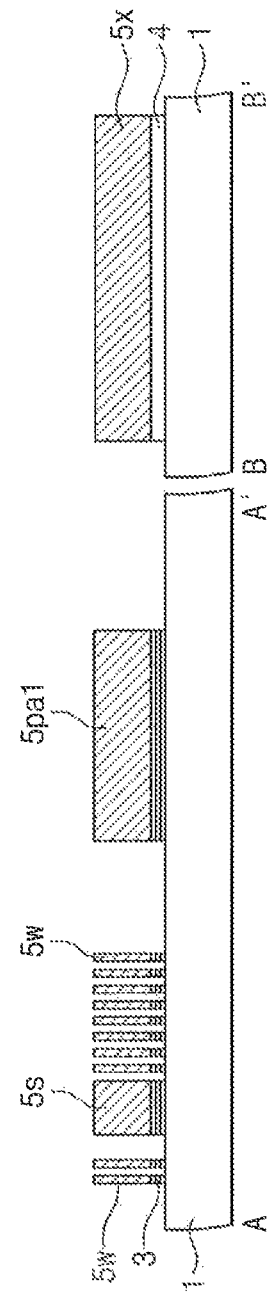

Referring to FIGS. 12A and 12B, the etch target layer 5 and the gate dielectric layers 3 and 4 may be etched using the second spacer patterns 28w, 28p, and 28x and the first mask patterns 7s, 7pa1, 7pa2, 7pb1, 7pb2, and 7x as an etch mask to form a plurality of word lines 5w, a selection line 5s, pad lines 5p respectively bent from the word lines 5w and selection line 5s, conductive pads 5pa1, 5pa2, 5pb1, and 5pb2 respectively connected to end portions of the pad lines 5p, and a peripheral gate electrode 5x.

In the method of fabricating the semiconductor device according to an exemplary embodiment of the present inventive concept, the process margin may be increased. In addition, fine patterns may be formed having a pitch smaller than a minimum pitch defined by an exposure process.

In the semiconductor device illustrated in FIGS. 12A and 12B, line-protrusions 5sp may be disposed at both corners of an end portion of the selection line 5s. The line-protrusions 5sp may have a width that corresponds to (or may be substantially equal to) the width (1F) of the word line. Sidewalls S1 of the conductive pads 5pa1, 5pa2, 5pb1, and 5pb2 may have a curved shape when viewed from a plan view. A pad protrusion 5pp may be disposed at a corner of an end portion of each of the conductive pads 5pa1, 5pa2, 5pb1, and 5pb2. The pad protrusion 5pp may have a width that corresponds to (or may be substantially equal to) the width (1F) of the word line.

FIGS. 13A, 14A, 15A, 16A, 17A, and 18A are plan views illustrating a method of fabricating a semiconductor device according to an exemplary embodiment of the present inventive concept. FIGS. 13B, 14B, 15B, 16B, 17B, and 18B are cross-sectional views taken along lines A-A' and B-B' of FIGS. 13A, 14A, 15A, 16A, 17A, and 18A, respectively.

Figure 13A:
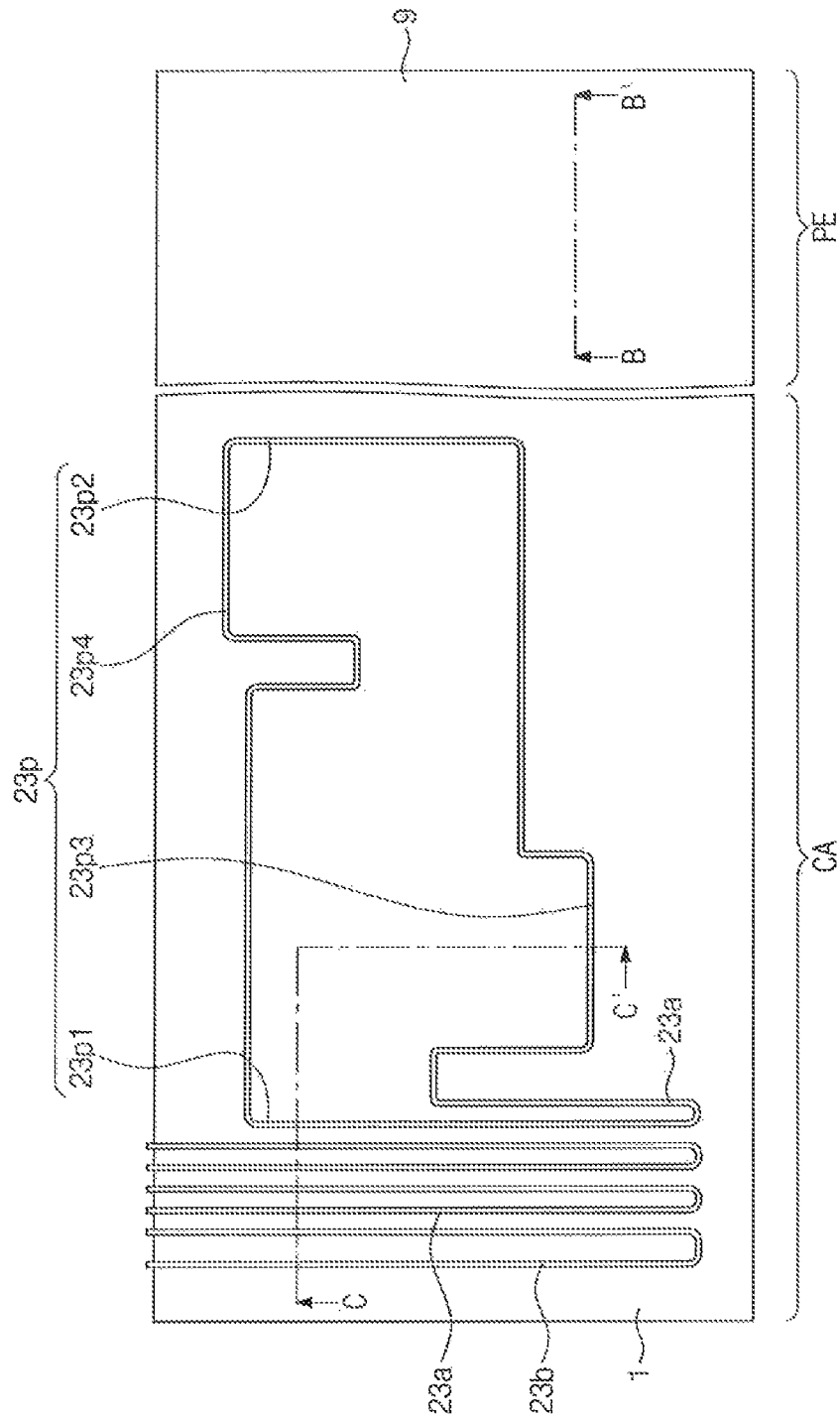
Figure 13B:
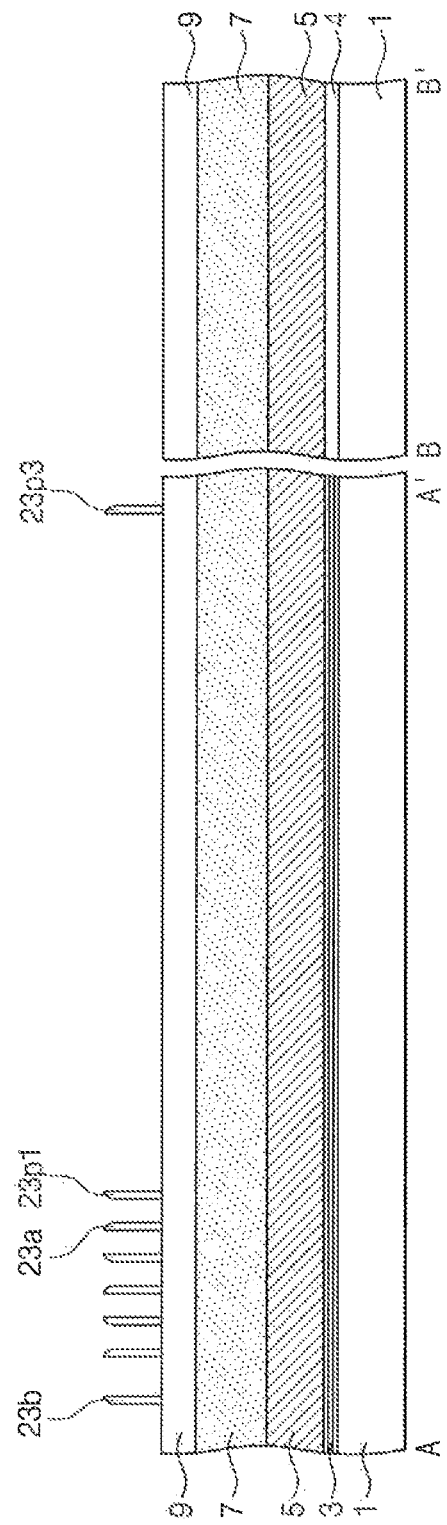
FIGS. 13B, 14B, 15B, 16B, 17B, and 18B are cross-sectional views taken along lines A-A' and B-B' of FIGS. 13A, 14A, 15A, 16A, 17A, and 18A, respectively.

Referring to FIGS. 13A and 13B, a shape of a pad may be changed according to an exemplary embodiment of the present inventive concept. The first photoresist pad pattern 21p of FIG. 1A may have bent sidewalls, but need not have a rectangular shape. The first spacer pad line 23p may be formed through the processes illustrated in FIGS. 1A, 2A, 3A, and 4A and 1B, 2B, 3B, and 4B and may have a shape different from the rectangular shape. The first spacer pad line 23p may include a first pad line 23p1 extending from the 1a-th spacer line pattern 23a in a direction parallel to the 1a-th spacer line pattern 23a; a third pad line 23p3 extending in a direction bent from the 1a-th spacer line pattern 23a; a second pad line 23p2 connected to the third pad line 23p3 and parallel to the first pad line 23p1; and a fourth pad line 23p4 connected to the first and second pad lines 23p1 and 23p2 and parallel to the third pad line 23p3. The third pad line 23p3 and the fourth pad line 23p4 may be bent.

Figure 14B:
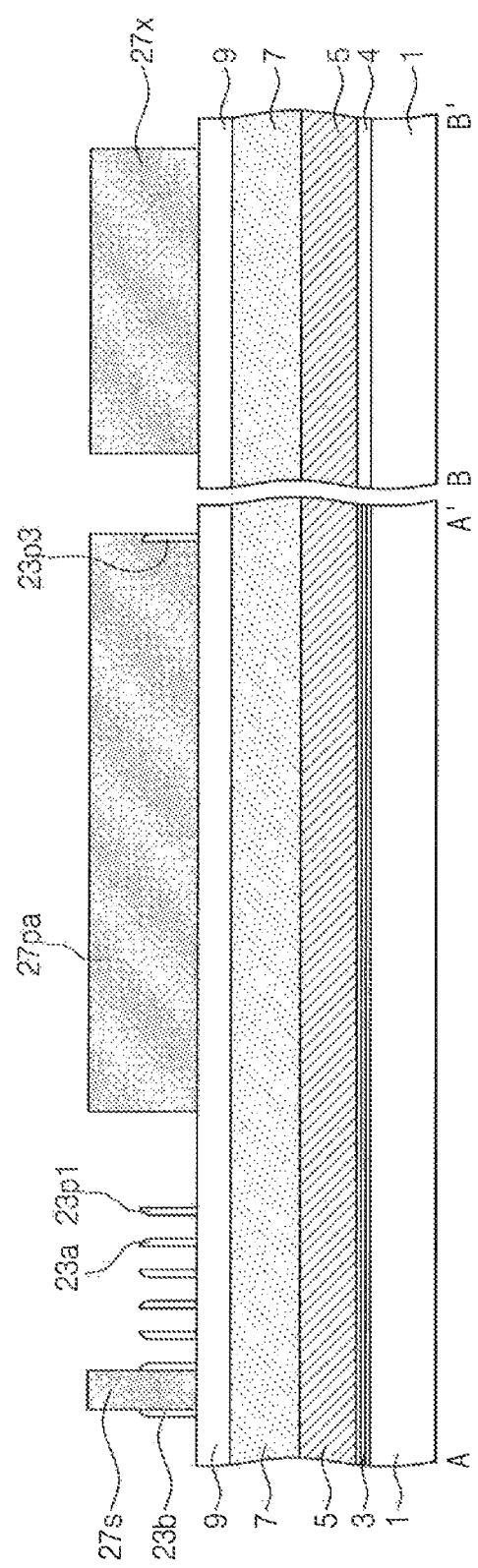

Referring to FIGS. 14A and 14B, second photoresist patterns 27s, 27pa, 27pb, and 27x may be formed on the second mask layer 9. The second photoresist patterns 27s, 27pa, 27pb, and 27x may include the second photoresist selection line pattern 27s defining the string selection line or ground selection line, the 2a-th photoresist pad pattern 27pa, the 2b-th photoresist pad pattern 27pb, and the second photoresist peripheral pattern 27x defining the peripheral circuit gate electrode. The 2a-th photoresist pad pattern 27pa and the 2b-th photoresist pad pattern 27pb may be spaced apart from each other. In an exemplary embodiment of the present inventive concept, the second photoresist selection line pattern 27s may fill an inside empty space of the 1b-th spacer line pattern 23b having a closed-loop shape.

The 2a-th photoresist pad pattern 27pa and the 2b-th photoresist pad pattern 27pb may be in contact with portions of the first spacer pad line 23p. The 2a-th photoresist pad pattern 27pa may be in contact with the bent portion of the third pad line 23p3. The 2a-th photoresist pad pattern 27pa may be spaced apart from the first, second, and fourth pad lines 23p1, 23p2, and 23p4. The 2b-th photoresist pad pattern 27pb may be in contact with the bent portion of the fourth pad line 23p4. The 2b-th photoresist pad pattern 27pb may be in contact with the second pad line 23p2 and a portion of the third pad line 23p3. A sidewall, which may be in contact with the first spacer pad line 23p, of each of the 2a-th and 2b-th photoresist pad patterns 2pa and 27pb may have laterally protruding portions of which protruding lengths progressively increase when viewed from a plan view. In other words, the sidewall of each of the 2a-th and 2b-th photoresist pad patterns 2pa and 27pb may have a stepped structure when viewed in a plan view, as illustrated in FIG. 14A. Thus, even when slight mask misalignment occurs during the formation of the 2a-th and 2b-th photoresist pad patterns 27pa and 2pb, the 2a-th and 2b-th photoresist pad patterns 2pa and 27pb may be in contact with the first spacer pad line 23p. In other words, the occurrence of a disconnection defect between the conductive pad and a conductive pad formed in subsequent processes may be reduced or prevented and the process margin may be increased.

Figure 15A:
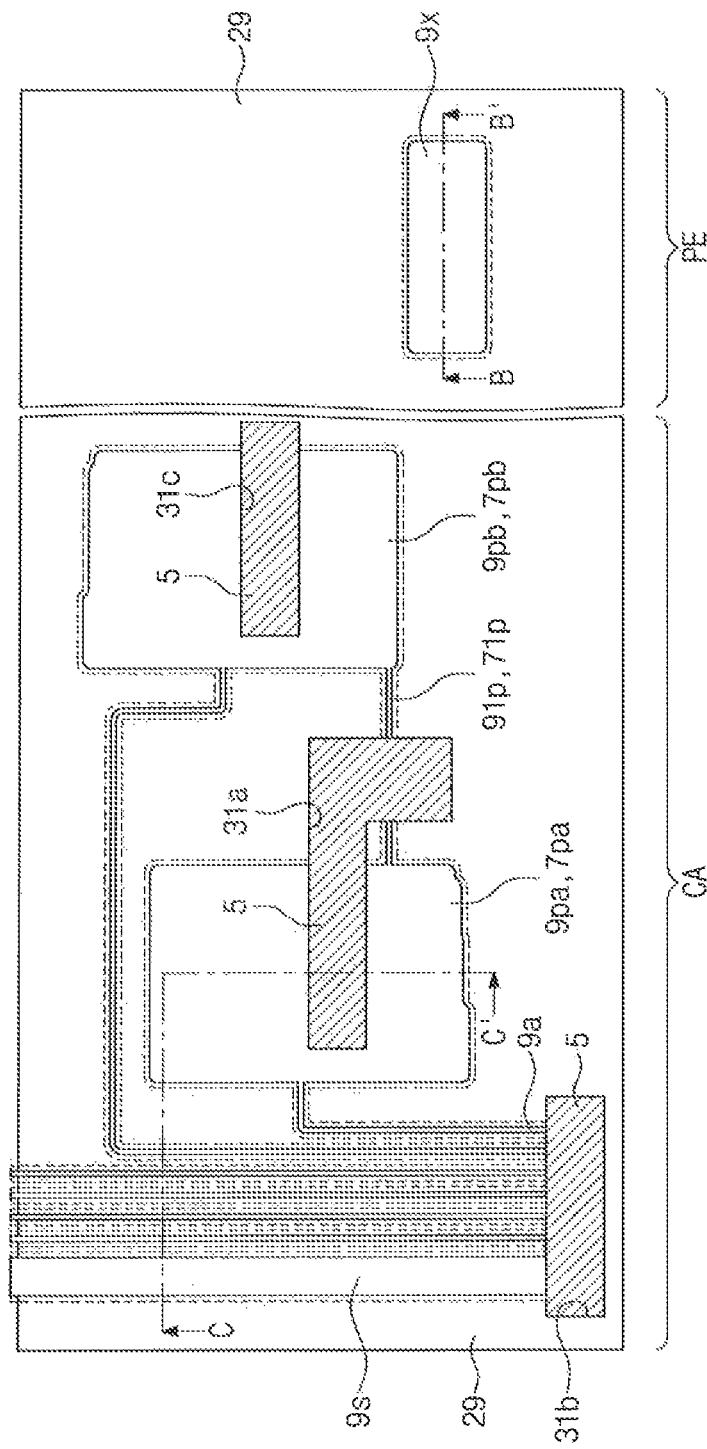
Figure 15B:
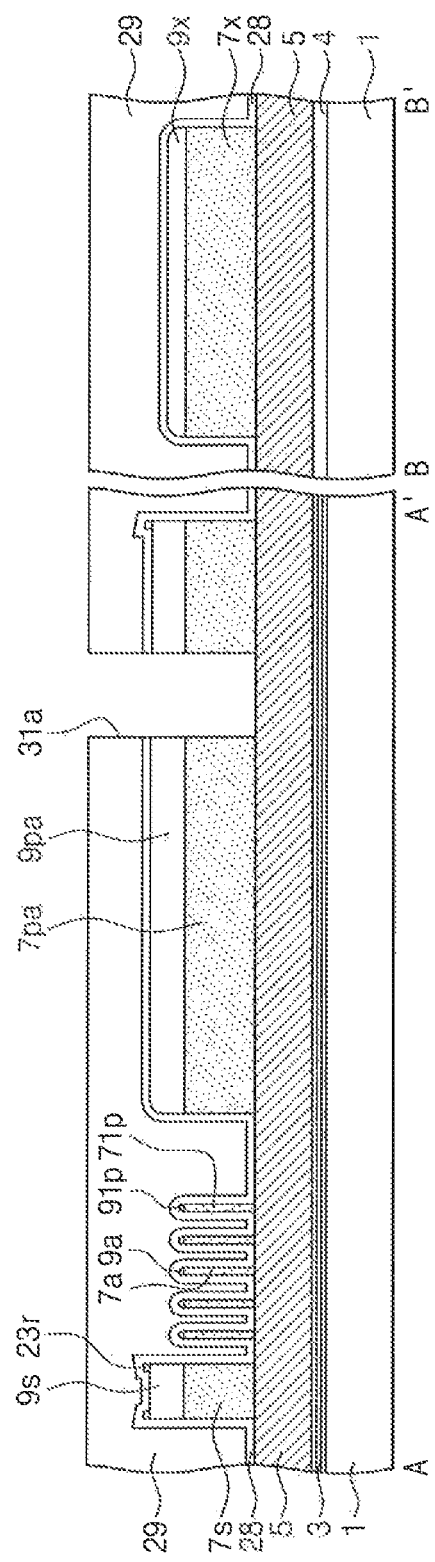

Referring to FIGS. 15A and 15B, the second mask layer 9 and the first mask layer 7 may be etched using the second photoresist patterns 27s, 27pa, 27pb, and 27x and the first spacer patterns 23a, 23b, and 23p as an etch mask to expose the etch target layer 5 and to form second mask patterns 9s, 9a, 9pa, 9pb, 91p, and 9x and first mask patterns 7s, 7a, 7pa, 7pb, 71p, and 7x respectively disposed under the second mask patterns 9s, 9a, 9pa, 9pb, 91p, and 9x. The second photoresist patterns 27s, 27pa, 27pb, and 27x may be etched and completely removed during the process of etching the second mask layer 9 and the first mask layer 7. Portions 23r of the first spacer patterns 23a, 23b, and 23p may remain on the second mask patterns 9s, 9pa, and 9pb. The second mask patterns 9s, 9a, 9pa, 9pb, 91p, and 9x may include a second mask line pattern 9a, the second mask selection line pattern 9s, the second mask pad line pattern 91p, the 2a-th mask pad pattern 9pa, the 2b-th mask pad pattern 9pb, and the second mask peripheral pattern 9x. In an exemplary embodiment of the present inventive concept, end portions of the second mask selection line pattern 9s and the second mask line pattern 9a may be spaced apart from each other. The first mask patterns 7s, 7a, 7pa, 7pb, 71p, and 7x may include the first mask line pattern 7a, the first mask selection line pattern 7s, the first mask pad line pattern 71p, the 1a-th mask pad pattern 7pa, the 1b-th mask pad pattern 7pb, and the first mask peripheral pattern 7x. In an exemplary embodiment of the present inventive concept, end portions of the first mask selection line pattern 7s and the first mask line pattern 7a may be spaced apart from each other.

The second spacer layer 28 may be conformally formed on the entire top surface of the substrate 1. The third photoresist pattern 29 may be formed on the second spacer layer 28. The third photoresist pattern 29 may include first to third openings 31a, 31b, and 31c exposing portions of the second spacer layer 28. The first opening 31a may be L-shaped when viewed from a plan view. The first opening 31a may overlap with a portion of the 2a-th mask pad pattern 9pa and the second mask pad line pattern 91b connected thereto. The third opening 31c may overlap with a portion of the 2b-th mask pad pattern 9pb. The second opening 31b may overlap with end portions of the second mask line pattern 9a and the second mask selection line pattern 9s.

An anisotropic etching process may be performed using the third photoresist pattern 29 as an etch mask to remove the second spacer layer 28, the second mask patterns 9pa, 9pb, 91p, 9s, and 9a, and the first mask patterns 7pa, 7pb, 71p, 7s, and 7a through the first to third openings 31a, 31b, and 31c. The etch target layer 5 under the openings 31a, 31b, and 31c may be exposed. The first to third openings 31a, 31b, and 31c may extend downward to the top surface of the etch target layer 5. Shapes of the first to third openings 31a, 31b, and 31c may be transferred to the second spacer layer 28, the second mask patterns 9pa, 9pb, 91p, 9s, and 9a, and the first mask patterns 7pa, 7pb, 71p, 7s, and 7a by the anisotropic etching process. End portions of the line patterns 9a, 9s, 7a, and 7s may be removed and the closed-loops of the line patterns 9a, 9s, 7a, and 7s may be cut. Thus, line patterns parallel to each other may be formed.

Figure 16A:
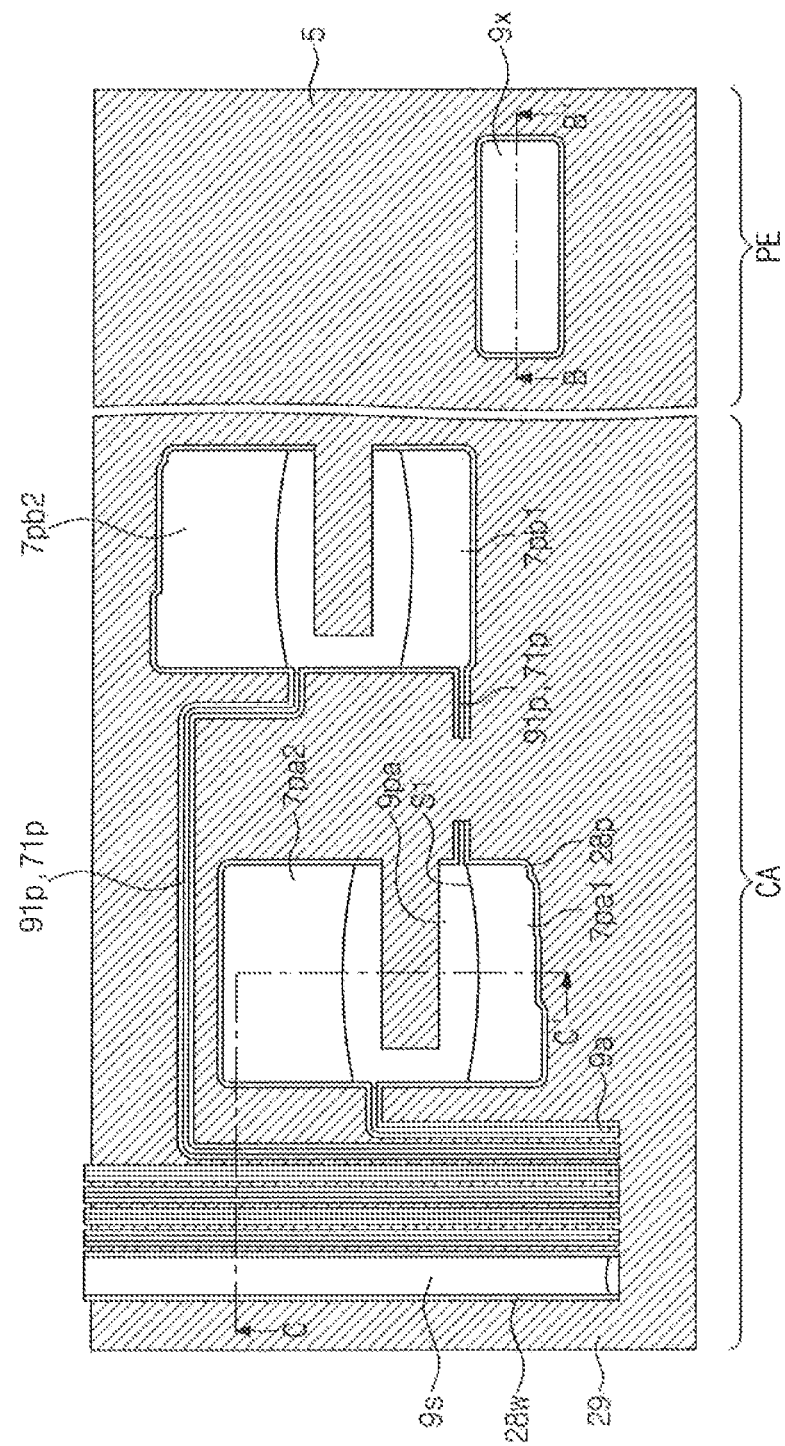
Figure 16B:
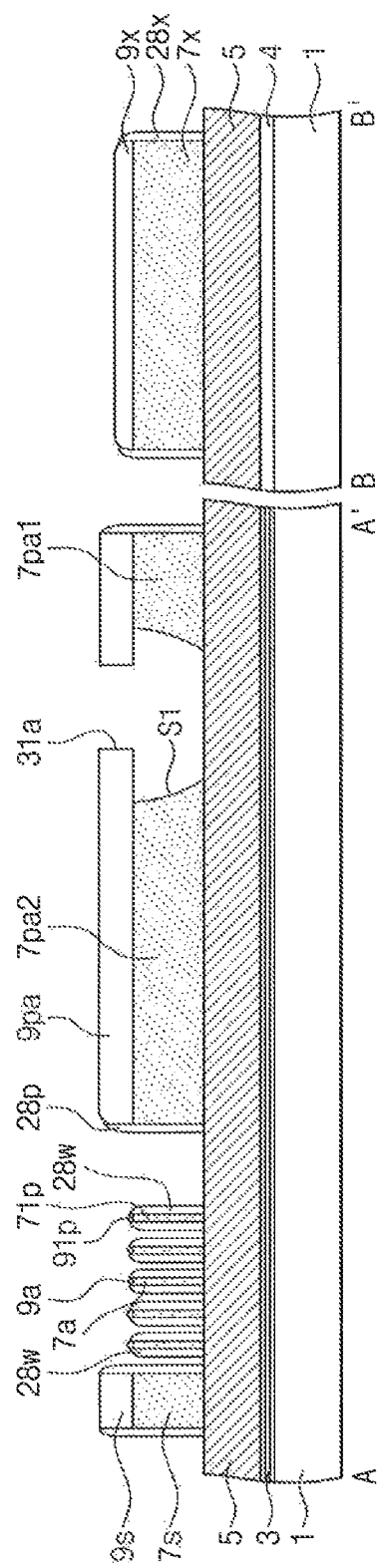

Referring to FIGS. 16A and 16B, the third photoresist pattern 29 may be removed to expose the second spacer layer 28. An anisotropic etching process may be performed on the second spacer layer 28 to form second spacer patterns 28w, 28p, and 28x. The second spacer patterns 28w, 28p, and 28x may include second spacer line patterns 28w covering sidewalls of the first mask line pattern 7a and the first mask selection line pattern 7s, second spacer pad line patterns 28p covering sidewalls of the first mask pad line pattern 71p, the 1a-th mask pad pattern 7pa and the 1b-th mask pad pattern 7pb, and a second spacer peripheral pattern 28x covering a sidewall of the first mask peripheral pattern 7x.

An isotropic etching process may be performed to partially remove the first mask patterns 7pa, 7pb, 71p, 7s, and 7a through the first to third openings 31a, 31b, and 31c. The 1a-th mask pad pattern 7pa may be divided into the 1aa-th mask pattern 7pa1 and the 1ab-th mask pattern 7pa2 separated from each other, and the 1b-th mask pad pattern 7pb may be divided into the 1ba-th mask pattern 7pb1 and the 1bb-th mask pattern 7pb2 separated from each other. Sidewalls S1 of the 1aa-th mask pattern 7pa1, the 1ab-th mask pattern 7pa2, the 1ba-th mask pattern 7pb1, and the 1bb-th mask pattern 7pb2 may be formed to have a curved shape by the isotropic etching process. An end portion of the first mask selection line pattern 7s may be partially removed by the isotropic etching process.

In an exemplary embodiment of the present inventive concept, the third photoresist pattern 29 may be removed, and the second spacer patterns 28w, 28p, and 28x may be formed. The isotropic etching process may be performed to partially remove the first mask patterns 7pa, 7pb, 71p, 7s, and 7a. However, the present inventive concept is not limited thereto. In an exemplary embodiment of the present inventive concept, the isotropic etching process may be performed to partially remove the first mask patterns 7pa, 7pb, 71p, 7s, and 7a after the removal of the third photoresist pattern 29, the second spacer patterns 28w, 28p, and 28x. In an exemplary embodiment of the present inventive concept, the isotropic etching process may be performed before the removal of the third photoresist pattern 29. In an exemplary embodiment of the present inventive concept, the second spacer patterns 28w, 28p, and 28x may be formed before the formation of the third photoresist pattern 29.

Figure 17A:
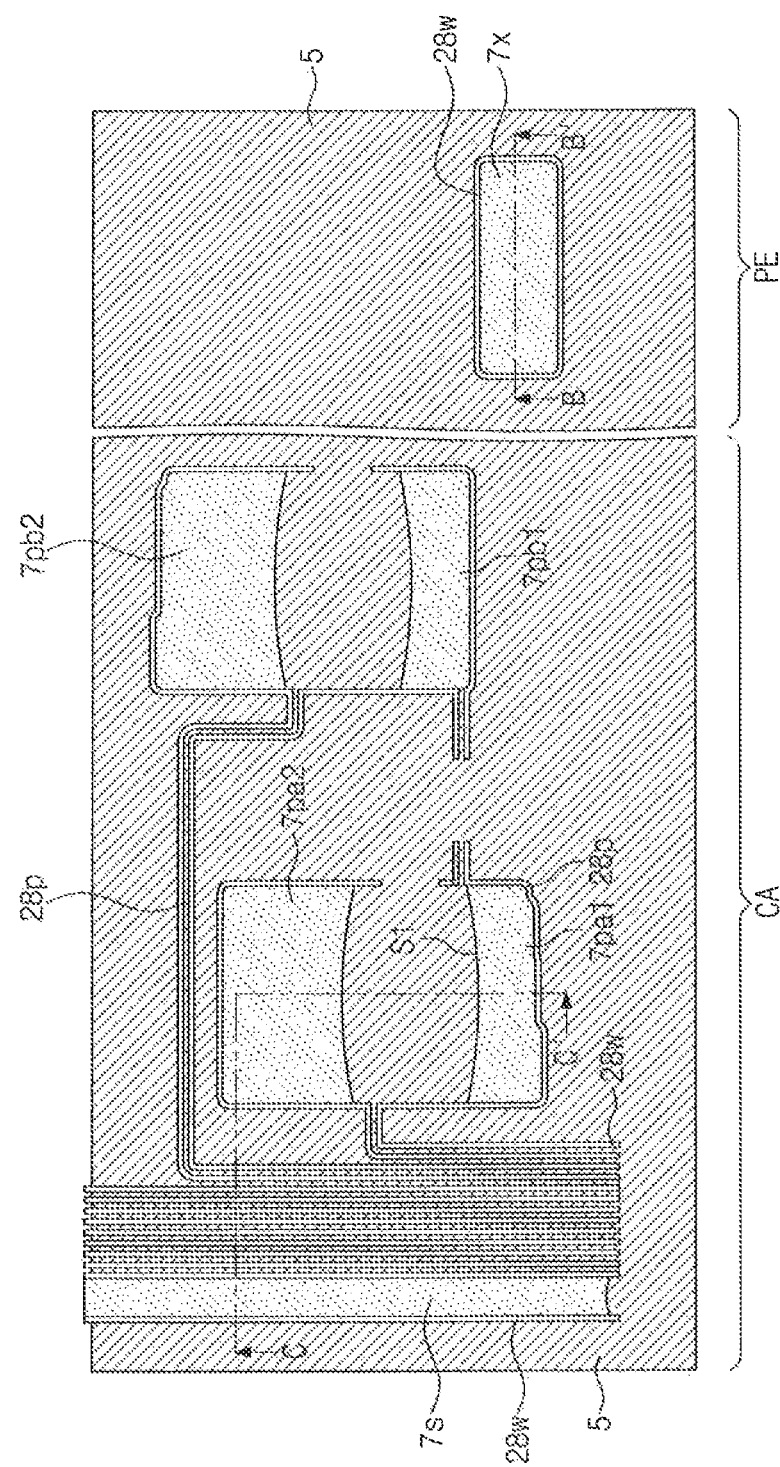
Figure 17B:
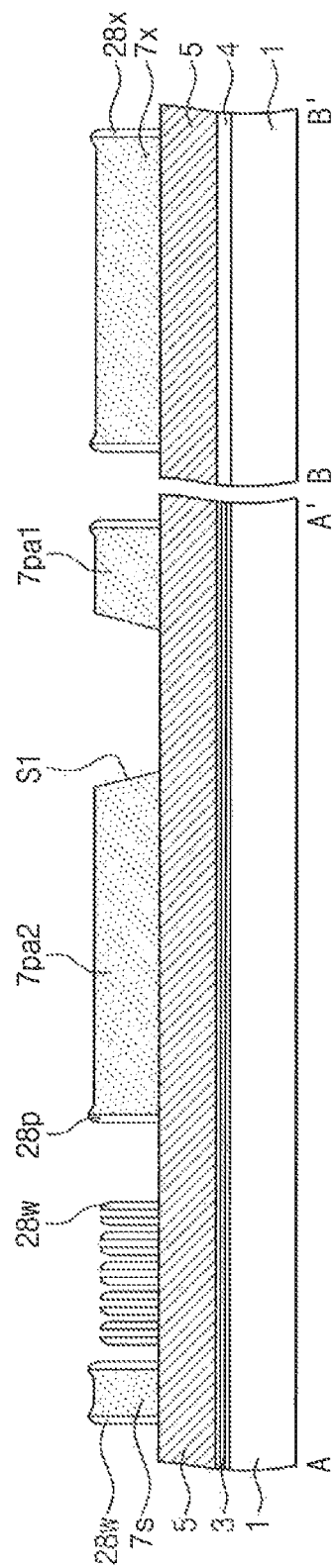

Referring to FIGS. 17A and 17B, an anisotropic etching process may be performed to remove the second mask patterns 9pa, 9pb, 91p, 9s, and 9a. When the second mask line patterns 9a and the second mask pad line pattern 91p are relatively thin, the first mask line patterns 7a and the first mask pad line pattern 71p disposed thereunder may be removed. The second spacer patterns 28w, 28p, and 28x and the first mask patterns 7s, 7pa1, 7pa2, 7pb1, 7pb2, and 7x of which widths may be greater than those of patterns 28*w*, 28*p*, and 28*x* may remain on the etch target layer 5.

Figure 18A:
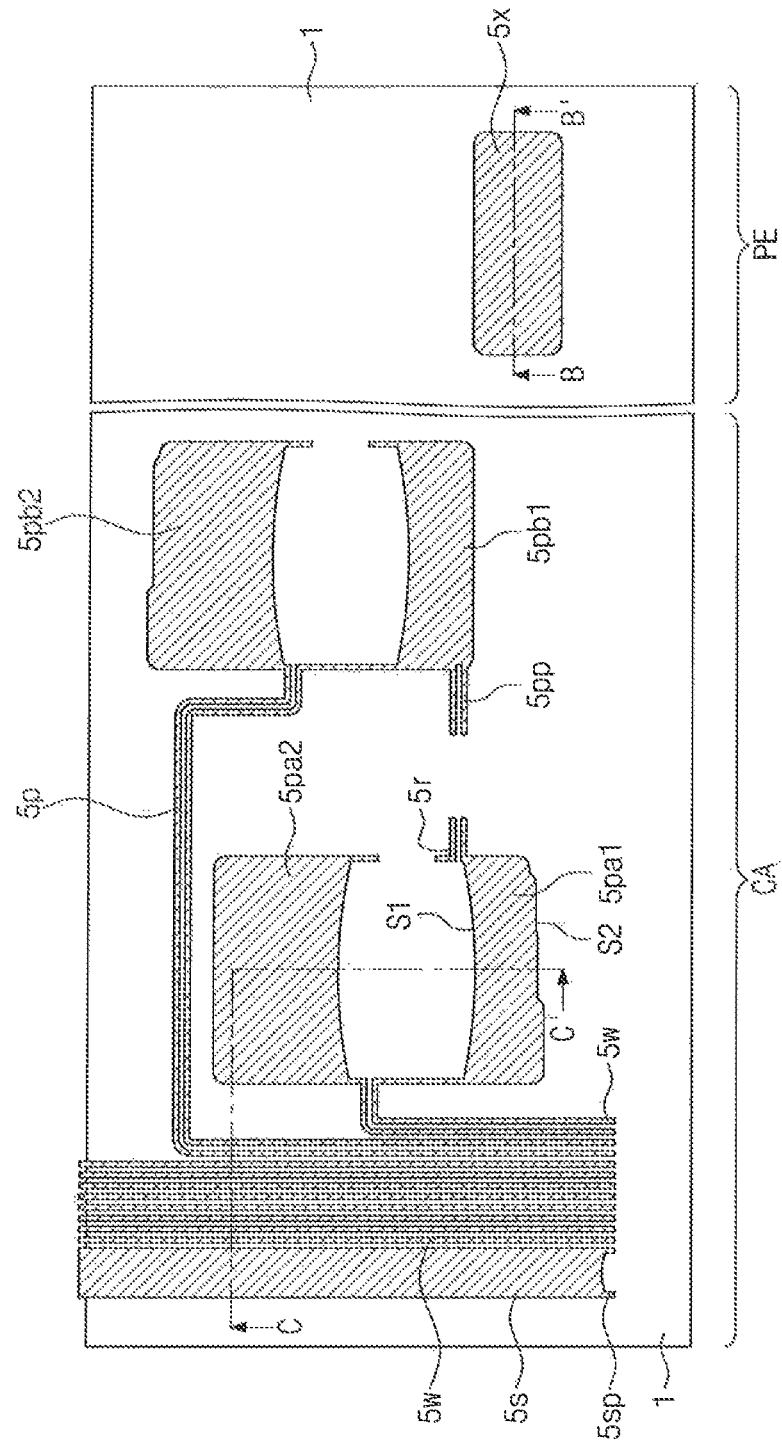
Figure 18B:
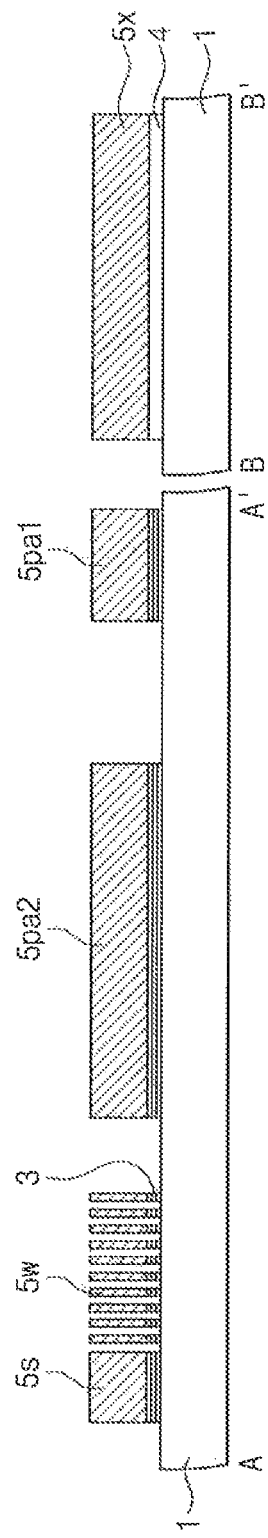

Referring to FIGS. 18A and 18B, the etch target layer 5 and the gate dielectric layers 3 and 4 may be etched using the second spacer patterns 28*w*, 28*p*, and 28*x* and the first mask patterns 7*s*, 7*pa*1, 7*pa*2, 7*pb*1, 7*pb*2, and 7*x* as an etch mask to form the plurality of word lines 5*w*, the selection line 5*s*, pad lines 5*p* respectively bent from the lines 5*w* and 5*s*, conductive pads 5*pa*1, 5*pa*2, 5*pb*1, and 5*pb*2 respectively connected to end portions of the pad lines 5*p*, and a peripheral gate electrode 5*x*. The conductive pads 5*pa*1, 5*pa*2, 5*pb*1, and 5*pb*2 may include a first conductive pad 5*pa*1, a second conductive pad 5*pa*2, a third conductive pad 5*pb*1, and a fourth conductive pad 5*pb*2.

In the semiconductor device of FIGS. 18A and 18B, line protrusions 5*sp* may be disposed at both corners of one end portion of the selection line 5*s*. The line protrusions 5*sp* may have a width that corresponds to (or may be substantially equal to) the width (1F) of the word line. First sidewalls S1 of the conductive pads 5*pa*1, 5*pa*2, 5*pb*1, and 5*pb*2 may have a curved shape when viewed from a plan view. A second sidewall S2, opposite to the first sidewall S1, of at least one of the conductive pads 5*pa*1, 5*pa*2, 5*pb*1, and 5*pb*2 may have laterally protruding portions of which protruding lengths progressively increase when viewed from a plan view. In other words, the second sidewall S2 may have a stepped structure when viewed from a plan view. The pad protrusion 5*pp* may be disposed at a corner of an end portion of each of the conductive pads 5*pa*1, 5*pa*2, 5*pb*1, and 5*pb*2. The pad protrusion 5*pp* may have a width that corresponds to (or may be substantially equal to) the width (1F) of the word line. A residual conductive pad line 5*r* may be adjacent to the pad protrusion 5*pp* of the first conductive pad 5*pa*1. The residual conductive pad line 5*r* may be isolated. The residual conductive pad line 5*r* may have a width that corresponds to (or may be substantially equal to) the width (1F) of the word line.

Other elements and other fabricating processes of the semiconductor device according to the exemplary embodiment, described with reference to FIGS. 13A, 13B, 14A, 14B, 15A, 15B, 16A, 16B, 17A, 17B, 18A, and 18B, may be the same as corresponding elements and corresponding processes of the semiconductor device described with reference to FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, and 12B.

Figure 19:
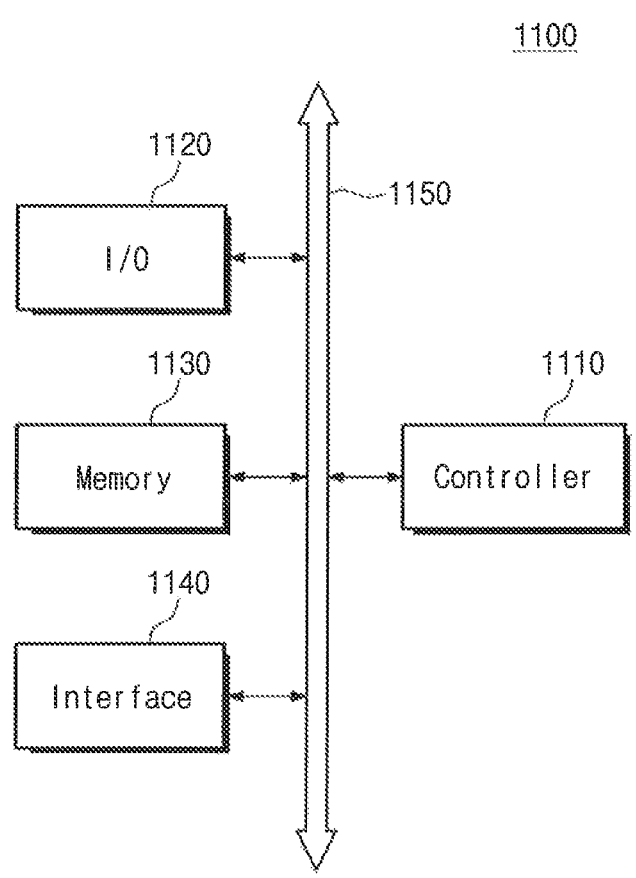
FIG. 19 is a block diagram illustrating a memory system including a semiconductor device according to an exemplary embodiment of the present inventive concept.

FIG. 19 is a block diagram illustrating a memory system including a semiconductor device according to an exemplary embodiment of the present inventive concept.

Referring to FIG. 19, a memory system 1100 may be used in a personal digital assistant (PDA), a portable computer, a web tablet, a wireless phone, a mobile phone, a digital music player, a memory card, or other electronic products receiving or transmitting information data wirelessly.

The memory system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices. Functions of the other logic devices may be similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include a semiconductor device according to an exemplary embodiment of the present inventive concept. The memory device 1130 may include another type of semiconductor memory device and a volatile random access memory device.

The interface unit 1140 may transmit electrical data to a communication network or may receive electrical data from a communication network.

Figure 20:
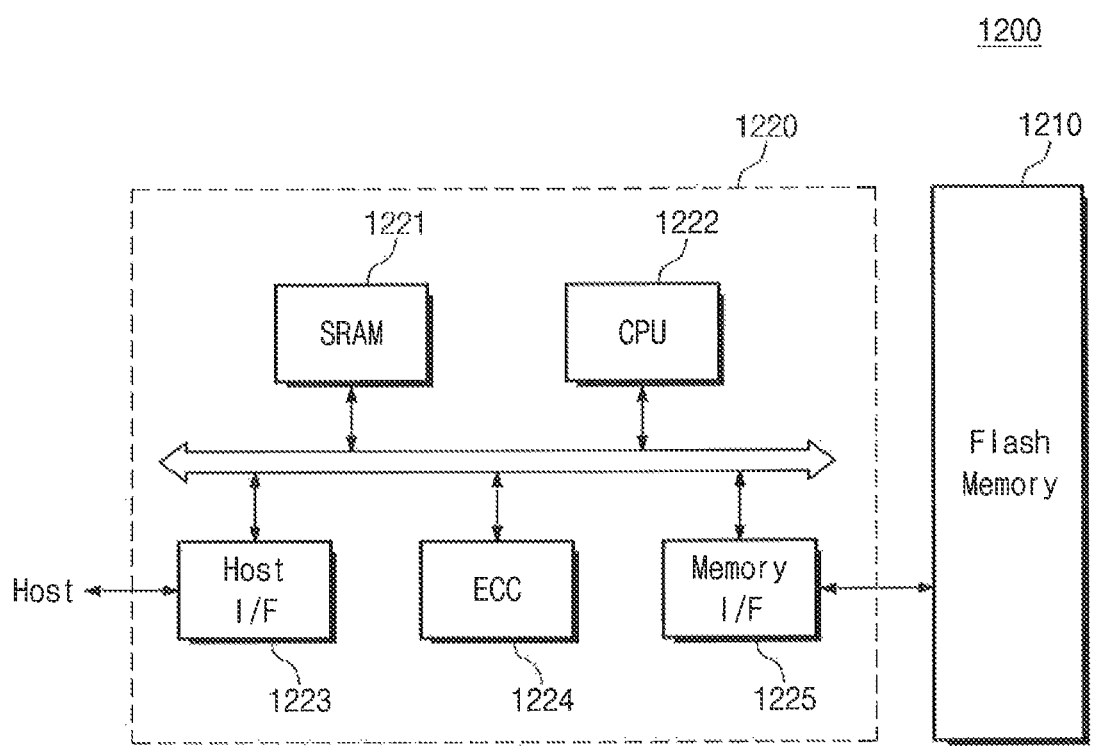
FIG. 20 is a block diagram illustrating a memory card including a semiconductor device according to an exemplary embodiment of the present inventive concept.

FIG. 20 is a block diagram illustrating a memory card including a semiconductor device according to an exemplary embodiment of the present inventive concept.

Referring to FIG. 20, a memory card 1200 for storing high-capacity data may include a flash memory device 1210 and a semiconductor device manufactured according to an exemplary embodiment of the present inventive concept. The memory card 1200 may include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the memory card 1200 and the host. An error check and correction (ECC) block 1224 may detect and correct data errors which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may include a read only memory (ROM) storing code data for interfacing with the host.

A semiconductor memory device manufactured according to an exemplary embodiment of the present inventive concept may be used in a solid state disk (SSD).

Figure 21:
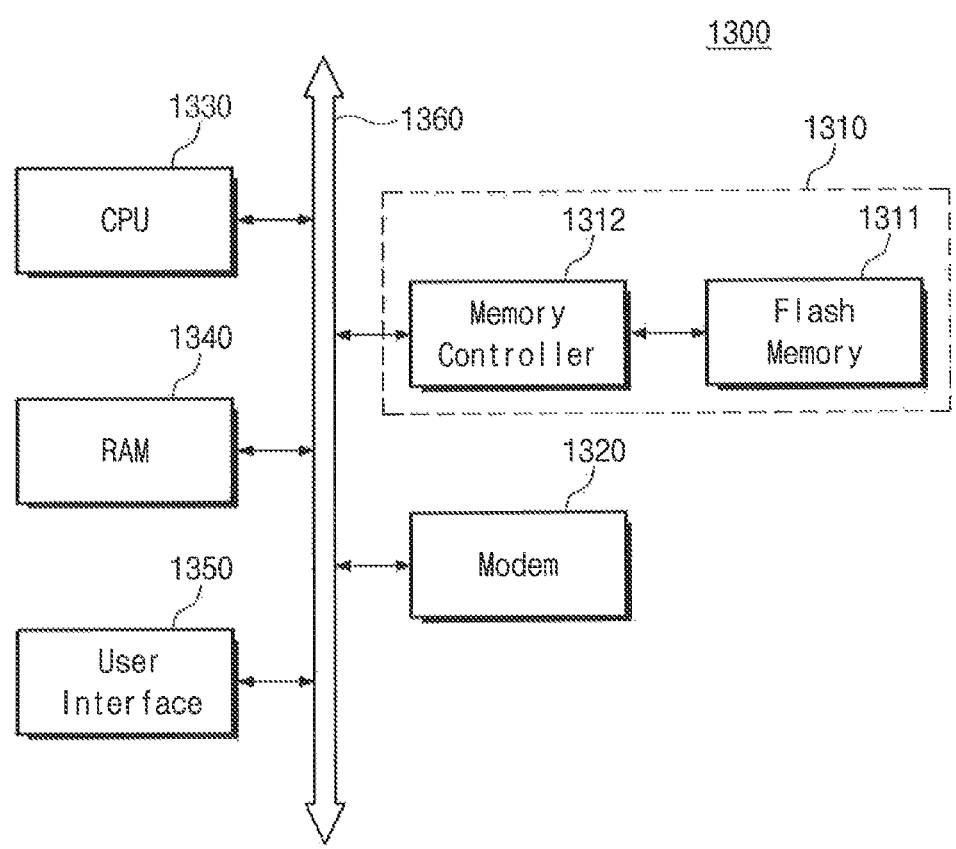
FIG. 21 is a block diagram illustrating an information processing system including a semiconductor device according to an exemplary embodiment of the present inventive concept.

FIG. 21 is a block diagram illustrating an information processing system including a semiconductor device according to an exemplary embodiment of the present inventive concept.

Referring to FIG. 21, an information processing system 1300 (e.g., a mobile device or a desk top computer) may include a flash memory system 1310 including a semiconductor device manufactured according to an exemplary embodiment of the present inventive concept. The information processing system 1300 may include a modem 1320, a central processing unit (CPU) 1330, a random access memory (RAM) device 1340, and a user interface unit 1350 which may be electrically connected to the flash memory system 1310 through a system bus 1360. The flash memory system 1310 may be substantially the same as the memory system or the memory card described above. The flash memory system 1310 may store data inputted from an external system and/or data processed by the CPU 1330. In an exemplary embodiment of the present inventive concept, the flash memory system 1310 may be a solid state disk (SSD). The information processing system 1300 may stably store large amounts of data in the flash memory system. As reliability of the flash memory system 1310 increases, the flash memory system 1310 may reduce an amount of resources consumed for correcting errors. An application chipset, a camera image processor (CIS), and an input/output unit may be included in the information processing system 1300.

A semiconductor device and/or a memory system according to an exemplary embodiment of the present inventive concept may be packaged using various packaging techniques. For example, the semiconductor device and/or the memory system according to an exemplary embodiment of the present inventive concept may be packaged using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to an exemplary embodiment of the present inventive concept, the third mask pad, the third mask selection line, and the third mask peripheral pattern for forming wide patterns may be formed after the formation of the first spacer patterns. The distance between the first spacer patterns may be equal to or greater than three times the width (1F) of the word line. Thus, the process margin of a photolithography process may be increased.

In addition, the third mask pad may intersect the first spacer pad line, and thus, the process margin may be further increased. Since the process margin increases, patterns may be formed having a pitch smaller than the minimum pitch realized by the exposure process.

While the present inventive concept has been particularly shown and described with reference to exemplary embodiments thereof, it will be understood by those of ordinary skill in the art that various changes in form and detail may be made therein without departing from the spirit and scope of the present inventive concept, as defined by the following claims.

What is claimed is:

1. A method of fabricating a semiconductor device, the method comprising:
    stacking an etch target layer, a first mask layer, and a second mask layer on a first surface of a substrate;
    forming a plurality of first spacer lines parallel to each other and a first spacer pad line on the second mask layer, wherein the first spacer pad line is laterally bent from an end portion of one or more of the first spacer lines, and wherein the first spacer pad line is spaced apart from the first spacer lines;
    forming a third mask pad, wherein the third mask pad is in contact with the first spacer pad line;
    etching the second mask layer and the first mask layer using the third mask pad, the first spacer lines, and the first spacer pad line as an etch mask to form one or more first mask lines, a first mask preliminary pad connected to one of the first mask lines, and second mask patterns respectively covering top surfaces of the first mask lines and the first mask preliminary pad;
    forming a second spacer layer conformally covering sidewalls of the first mask lines, a sidewall of the first mask preliminary pad, sidewalls of the second mask patterns, top surfaces of the second mask patterns, and a top surface of the etch target layer;
    anisotropically etching the second spacer layer to form second spacer lines respectively covering sidewalls of the first mask preliminary pad and the first mask lines;
    removing a first portion of the first mask preliminary pad to form first mask pads separated from each other;
    removing the second mask patterns and the first mask lines; and
    etching the etch target layer using the second spacer lines and the first mask pads as an etch mask to form conductive lines and conductive pads connected to the conductive lines.

2. The method of claim 1, wherein the third mask pad intersects the first spacer pad line.

3. The method of claim 1, wherein first spacer lines adjacent to each other and the first spacer pad line connected thereto are connected to each other to form a closed-loop,
    wherein the third mask pad includes third mask pads adjacent to each other,
    wherein the first spacer pad line includes first spacer pad lines adjacent to each other, and
    wherein the third mask pads adjacent to each other are in contact with at least one of the first spacer pad lines adjacent to each other.

4. The method of claim 3, wherein forming the first spacer lines and the first spacer pad line comprises:
    forming fourth mask lines and a fourth mask pad connected to an end portion of at least one of the fourth mask lines on the second mask layer;
    forming the first spacer lines and the first spacer pad line respectively covering sidewalls of the fourth mask lines and the fourth mask pad and exposing a top surface of the second mask layer; and
    removing the fourth mask lines and the fourth mask pad,
    wherein a width of each of the fourth mask lines is equal to or greater than twice a width of the first spacer line.

5. The method of claim 4, wherein a distance between the fourth mask lines is equal to or greater than three times the width of the first spacer line.

6. The method of claim 4, further comprising:
    forming a protection layer covering sidewalls of the first spacer pad line and the first spacer lines and the exposed top surface of the second mask layer before removing the fourth mask lines and the fourth mask pad,
    wherein an etch rate of the protection layer is equal to etch rates of the fourth mask lines and the fourth mask pad.

7. The method of claim 1, wherein at least one sidewall of the third mask pad is in contact with the first spacer pad line, and wherein the third mask pad has laterally protruding portions of which protruding lengths increase.

8. The method of claim 1, wherein removing a portion of the first mask preliminary pad to form first mask pads separated from each other comprises:
    forming a fourth mask pattern including a first opening, the first opening overlapping a portion of the first mask preliminary pad and exposing the second spacer layer;
    performing an anisotropic etching process to remove the second spacer layer, the second mask pattern, and a portion of the first mask preliminary pad through the first opening;
    removing the fourth mask pattern; and
    removing a second portion of the first mask preliminary pad using an isotropic etching process to form the first mask pads separated from each other.

9. The method of claim 8, wherein end portions of the first spacer lines adjacent to each other are connected to each other,
    wherein the fourth mask pattern further includes a second opening overlapping the connected end portions of the first spacer lines, and wherein the first spacer lines adjacent to each other are separated from each other by the anisotropic etching process.

10. The method of claim 8, wherein the first mask pads include curved sidewalls.

11. The method of claim 1, further comprising:
forming a third mask selection line filling a space between the first spacer lines adjacent to each other;
etching the first mask layer using the third mask selection line as an etch mask to form a first mask selection line;
forming a second spacer selection line covering a sidewall of the first mask selection line; and
etching the etch target layer using the first mask selection line and the second spacer selection line as an etch mask to form a conductive selection line.

12. The method of claim 11, wherein corners of at least one end portion of the conductive selection line protrude laterally from a central portion of the end portion.

13. The method of claim 1, wherein a thickness of the second mask pattern disposed on the first mask line is smaller than a thickness of the second mask pattern disposed on the first mask pad.

14. The method of claim 1, wherein the substrate includes a cell array area and a peripheral circuit area,
wherein the first spacer lines, the first spacer pad line, and the third mask pad are formed in the cell array area, and
wherein a mask peripheral pattern is formed on the second mask layer in the peripheral circuit area.

15. A method of fabricating a semiconductor device, the method comprising:
stacking an etch target layer, a first mask layer, and a second mask layer on a first surface of a substrate;
forming a plurality of first spacer lines parallel to each other and a first spacer pad line on the second mask layer, wherein the first spacer pad line is laterally bent from an end portion of one or more of the first spacer lines, and wherein the first spacer pad line is spaced apart from the first spacer lines;
forming a third mask pad and a third mask selection line, wherein the third mask pad is in contact with the first spacer pad line, and the third mask selection line fills a space between the first spacer lines adjacent to each other;
etching the second mask layer and the first mask layer using the third mask pad, the third mask selection line, the first spacer lines, and the first spacer pad line as an etch mask to form one or more first mask lines, a first mask selection line, a first mask preliminary pad connected to one of the first mask lines, and second mask patterns respectively covering top surfaces of the first mask lines, the first mask selection line, and the first mask preliminary pad;
forming second spacer lines and a second spacer selection line, wherein the second spacer lines respectively cover sidewalls of the first mask preliminary pad and the first mask lines, and the second spacer selection line covers a sidewall of the first mask selection line;
removing a first portion of the first mask preliminary pad to form first mask pads separated from each other;
removing the second mask patterns and the first mask lines; and
etching the etch target layer using the second spacer lines, the first mask selection line, the second spacer selection line and the first mask pads as an etch mask to form conductive lines, a conductive selection line and conductive pads connected to the conductive lines.

* * * * *